United States Patent
Cho et al.

(10) Patent No.: US 8,873,290 B2
(45) Date of Patent: Oct. 28, 2014

(54) NON-VOLATILE MEMORY DEVICE CAPABLE OF MULTI-PAGE PROGRAMMING BY SIMULTANEOUSLY ACTIVATING A PLURALITY OF SELECTION LINES BASED ON PROGRAMMED DATA

(71) Applicant: SAMSUNG Electronics Co., Ltd, Suwon-si (KR)

(72) Inventors: Kyoung Lae Cho, Yongin-si (KR); Heeseok Eun, Hwaseong-si (KR); Junjin Kong, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/225,601

(22) Filed: Mar. 26, 2014

(65) Prior Publication Data

US 2014/0204675 A1 Jul. 24, 2014

Related U.S. Application Data

(62) Division of application No. 13/161,940, filed on Jun. 16, 2011, now Pat. No. 8,717,817.

(30) Foreign Application Priority Data

Jun. 16, 2010 (KR) ........................ 10-2010-0057265

(51) Int. Cl.
*G11C 16/10* (2006.01)
*G11C 16/34* (2006.01)

(52) U.S. Cl.
CPC ............ *G11C 16/10* (2013.01); *G11C 16/3459* (2013.01)

USPC ............ 365/185.12; 365/185.17; 365/185.22; 365/185.19; 365/185.03

(58) Field of Classification Search
USPC ............. 365/185.17, 185.22, 185.19, 185.18, 365/185.03, 185.12, 185.11
See application file for complete search history.

(56) References Cited

U.S. PATENT DOCUMENTS

| | | | |
|---|---|---|---|
| 6,674,685 B2 | 1/2004 | Fujino | |
| 6,858,906 B2 | 2/2005 | Lee et al. | |
| 8,243,518 B2 | 8/2012 | Oh et al. | |
| 8,717,817 B2 * | 5/2014 | Cho et al. | ................. 365/185.12 |
| 2004/0169238 A1 | 9/2004 | Lee et al. | |
| 2006/0180851 A1 | 8/2006 | Lee et al. | |

FOREIGN PATENT DOCUMENTS

| | | |
|---|---|---|
| JP | 2007-266143 | 10/2007 |
| JP | 2008-072051 | 3/2008 |
| KR | 1020080012667 | 2/2008 |
| KR | 1020090114859 | 11/2009 |

* cited by examiner

*Primary Examiner* — Andrew Q Tran
(74) *Attorney, Agent, or Firm* — Stanzione & Kim, LLP

(57) ABSTRACT

A method of programming a non-volatile memory device including a plurality of strings arranged in rows and columns comprises activating all or a part of selection lines in one column at the same time depending upon data to be programmed, driving a bit line corresponding to the one column with a bit line program voltage, and repeating the activating and the driving until bit lines corresponding to the columns are all driven.

20 Claims, 42 Drawing Sheets

Decoding Rule

| Data | 11 | 10 | 00 | 01 | Verify |
|------|-----|-----|-----|-----|--------|
| SSL  | OFF | OFF | OFF | ON  | Vvfy3  |
| SSL  | OFF | OFF | ON  | OFF | Vvfy2  |
| SSL  | OFF | ON  | OFF | OFF | Vvfy1  |

Fig. 14
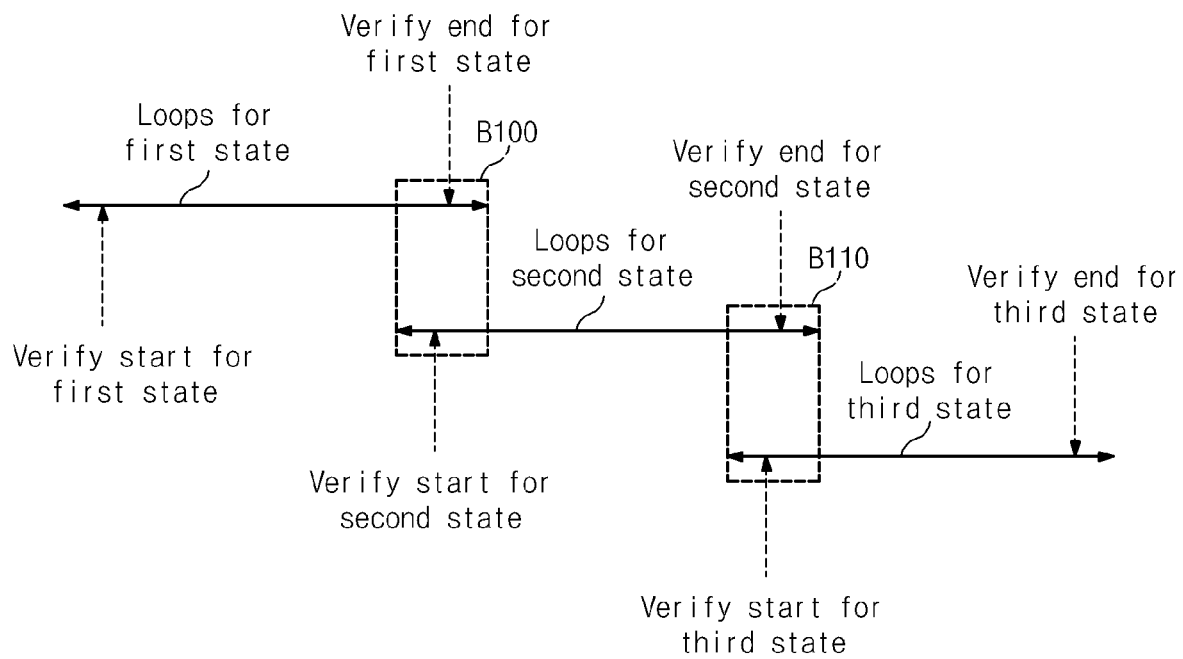
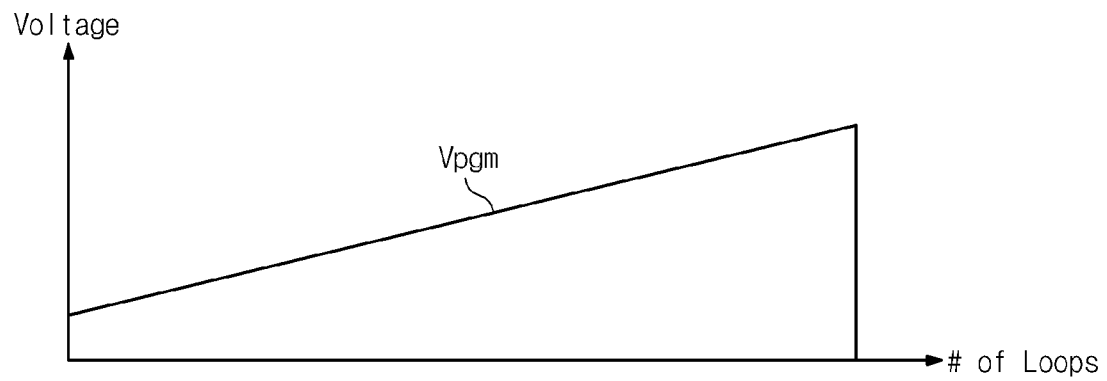

NON-VOLATILE MEMORY DEVICE CAPABLE OF MULTI-PAGE PROGRAMMING BY SIMULTANEOUSLY ACTIVATING A PLURALITY OF SELECTION LINES BASED ON PROGRAMMED DATA

CROSS-REFERENCE TO RELATED APPLICATIONS

This application is a Divisional application of prior application Ser. No. 13/161,940, filed on Jun. 16, 2011 in the United States Patent and Trademark Office, which claims priority under 35 U.S.C. §119(a) from Korean Patent Application No. 10-2010-0057265, filed on Jun. 16, 2010, in the Korean Intellectual Property Office, the disclosure of which is incorporated herein by reference in its entirety.

BACKGROUND OF THE INVENTION

1. Field of the Invention

Exemplary embodiments relate to a semiconductor memory device, and more particularly, relate to a multi-page programming method and a non-volatile memory device using the same.

2. Description of the Related Art

With advance in semiconductor fabrication technologies, high-density memories continue to be needed. Various approaches have been proposed to satisfy such need. One of the approaches is to increase the number of data bits stored in one memory cell. As another approach, there has been proposed a memory device having a three-dimensional array structure, which will be referred to a 3D memory device hereinafter.

SUMMARY OF THE INVENTION

One aspect of embodiments of the inventive concept is directed to provide a method of programming a non-volatile memory device including a plurality of strings arranged in rows and columns. The method comprises activating all or a part of selection lines in one column at the same time depending upon data to be programmed; driving a bit line corresponding to the one column with a bit line program voltage; and repeating the activating and the driving until bit lines corresponding to the columns are all driven.

Additional aspects and advantages of the present general inventive concept will be set forth in part in the description which follows and, in part, will be obvious from the description, or may be learned by practice of the general inventive concept.

Another aspect of embodiments of the inventive concept is directed to provide a non-volatile memory device which comprises a memory cell array including a plurality of strings arranged in rows and columns; the strings of each column being connected with a bit line via selection transistors each controlled by corresponding selection lines, and the strings of each row being connected with bit lines via selection transistors each controlled by corresponding selection lines; a row decoder circuit configured to drive the selection lines; and a control logic controlling the row decoder circuit to drive selection lines of each row simultaneously or individually according to a mode of operation.

Still another aspect of embodiments of the inventive concept is directed to provide a data storage system comprising a non-volatile memory device; and a controller controlling the non-volatile memory device. The non-volatile memory device includes a plurality of strings arranged in rows and columns, the strings of each column being connected with a bit line via selection transistors each controlled by corresponding selection lines, and the strings of each row being connected with bit lines via selection transistors each controlled by corresponding selection lines. The non-volatile memory device performs a program operation by activating all or a part of selection lines in one column at the same time depending upon data to be programmed; driving a bit line corresponding to the one column with a bit line program voltage; repeating the activating and the driving until bit lines corresponding to the columns are all driven; and applying a program voltage to the word lines.

Still another aspect of embodiments of the inventive concept is directed to provide a data storage system comprising a non-volatile memory device; and a controller controlling the non-volatile memory device. The non-volatile memory device includes a memory cell array including a plurality of strings arranged in rows and columns; the strings of each column being connected with a bit line via selection transistors each controlled by corresponding selection lines, and the strings of each row being connected with bit lines via selection transistors each controlled by corresponding selection lines; a row decoder circuit configured to drive the selection lines; a read and write block configured to drive the bit lines; and a control logic controlling the row decoder circuit and the read and write block. The control logic controls the row decoder circuit to activate all or a part of selection lines in each column simultaneously according to data to be programmed, and the control logic controls the read and write block to drive one of the bit lines with a bit line program voltage, with all or a part of selection lines in each column being activated simultaneously.

Features of the present general inventive concept may also be realized by a method of programming a non-volatile memory device having a plurality of strings of transistors arranged in series, the plurality of strings being arranged in rows and columns corresponding to word lines and bit lines, respectively, the method including charging at least one string of a row to a charge voltage, applying a program voltage to at least one word line to program a transistor of the at least one string, and performing a verify operation by applying a verify voltage to the word line to verify the program state of the transistor.

Charging at least one string may include simultaneously charging a plurality of strings of the row, and applying the program voltage to the word line may include applying the program voltage to a plurality of word lines to program a transistor of each of the plurality of charged strings.

Charging the at least one string may include applying a gate voltage to a string selection transistor corresponding to the at least one string.

Charging the at least one string further may include applying the charge voltage to a bit line connected to the string selection transistor while the gate voltage is applied to the string selection transistor.

The method may further include repeating the charging operation, the applying a program operation, and the performing a verify operation for each transistor of a column until each transistor of the column is programmed.

Performing the verify operation may include applying the verify voltage to a plurality of word lines corresponding to each transistor of a column of transistors.

Performing the verify operation may further include turning off string selection transistors corresponding to each of the strings of the column of transistors while the verify voltage is applied to the plurality of word lines.

Features of the present general inventive concept may also be realized by a non-volatile memory device, including a plurality of strings of transistors connected in series, the plurality of strings of transistors arranged in rows and columns, a plurality of bit lines, each bit line connected to each string in a column of strings, a plurality of word lines, each word line connected to each string of a row of strings, and control logic to perform at least one of a program and a verify operation simultaneously on transistors from a plurality of strings.

The non-volatile memory device may further include a plurality of string selection transistors corresponding to the plurality of strings, respectively.

The control logic may perform the program operation by simultaneously turning on at least two string selection transistors from among the plurality of string selection transistors and applying a predetermined voltage to a bit line connected to the at least two string selection transistors.

The control logic may perform the verify operation by simultaneously applying a verify voltage to each word line corresponding to a column of transistors while turning off each string selection transistor corresponding to the strings in which the column of transistors are located.

The plurality of word lines may include a plurality of conductive patterns formed in layers stacked on a substrate.

The plurality of strings may include a plurality of columns of semiconductor material arranged vertically with respect to the substrate to intersect the plurality of word lines.

The plurality of bit lines may include a plurality of parallel wires located above an upper-most layer of word lines from among the stacked layers.

BRIEF DESCRIPTION OF THE DRAWINGS

The above and other objects and features will become apparent from the following description with reference to the following figures, wherein like reference numerals refer to like parts throughout the various figures unless otherwise specified, and wherein:

FIG. 14 is a diagram for describing a program method of a non-volatile memory device according to another exemplary embodiment of the inventive concept.

DETAILED DESCRIPTION OF THE PREFERRED EMBODIMENTS

Figure 1:
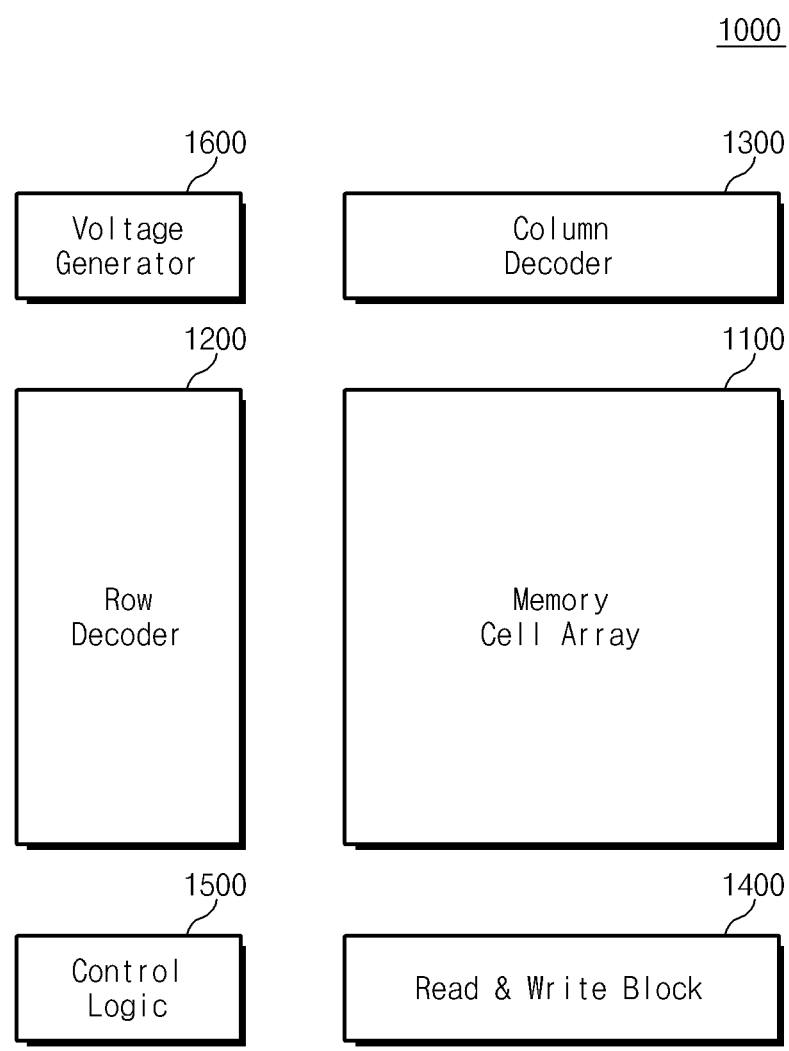
FIG. 1 is a block diagram showing a non-volatile memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram showing a non-volatile memory device according to an exemplary embodiment of the inventive concept.

A non-volatile memory device 1000 according to an exemplary embodiment of the inventive concept may be a NAND flash memory device, for example. But, it is well understood that the inventive concept is not limited to a flash memory device. For example, the inventive concept may be applied to non-volatile memory devices such as a NOR flash memory device, a PRAM, a FeRAM, an MRAM, and the like. As illustrated in FIG. 1, the non-volatile memory device 1000 may include a memory cell array 1100, a row decoder circuit 1200, a column decoder circuit 1300, a read and write block 1400, control logic 1500, and a voltage generator circuit 1600.

The memory cell array 1100 may include memory cells for storing single-bit data and/or M-bit data (M being 2 or more integer). Memory cells (or, memory cell transistors) may be arranged at intersections of rows (or, word lines) and columns (or, bit lines) in a two or three dimension, respectively. Each memory cell may have a variable resistance value. For example, each memory cell may have a threshold voltage which varies according to charge storage or variable resistance. But, it is well understood that a memory cell type is not limited to this disclosure. As will be described hereinafter, the memory cell array 1100 according to an exemplary embodiment of the inventive concept may be configured to have a vertical channel structure or a vertical string structure. With the vertical channel structure/vertical string structure, channels (or, a string channel) of memory cells (or, memory cell transistors) in one string may be formed to be vertical on a substrate, which will be more fully described hereinafter.

Continuing to refer to FIG. 1, the row decoder circuit 1200 operates responsive to the control of the control logic 1500 and makes selection and driving of rows of the memory cell array 1100. The column decoder circuit 1300 operates responsive to the control of the control logic 1500 and makes selection of columns of the memory cell array 1100. The read and write block 1400 operates responsive to the control of the control logic 1500 and is configured to read data from the memory cell array 1100 and to write data in the memory cell array 1100. The voltage generator circuit 1600 operates responsive to the control of the control logic 1500 and is configured to generate voltages necessary for operations such as read, program, verify, and erase operations.

Figure 2:
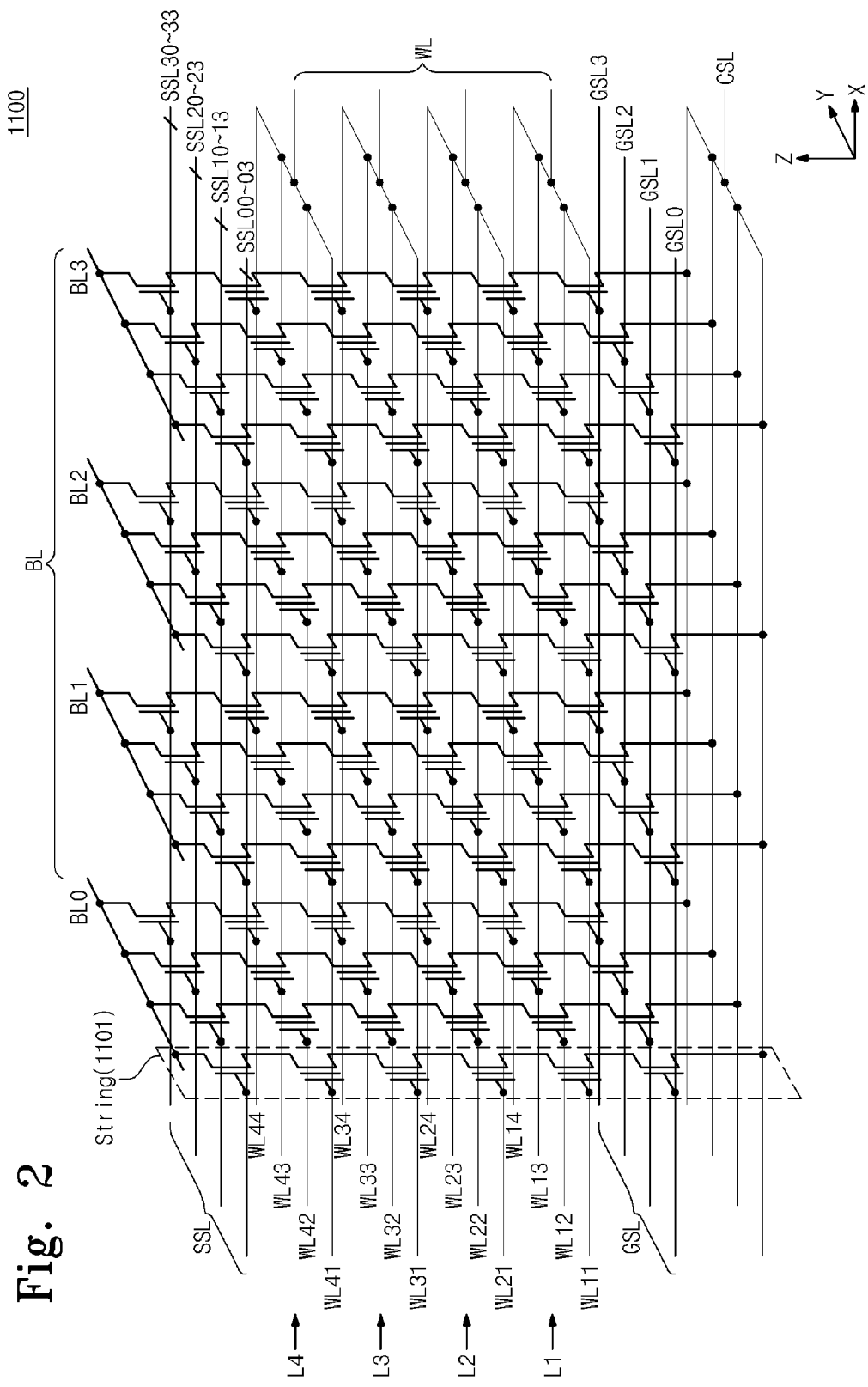
FIG. 2 a diagram showing a circuit structure of a memory cell array illustrated in FIG. 1 according to an exemplary embodiment of the inventive concept.

FIG. 2 is a diagram showing a circuit structure of a memory cell array illustrated in FIG. 1 according to an exemplary embodiment of the inventive concept.

Referring to FIG. 2, a memory cell array 1100 according to an exemplary embodiment of the inventive concept may be implemented to have a vertical string structure. With the vertical string structure, a string is formed not to be parallel to a substrate (not shown), but to be vertical to the substrate. For ease of illustration, in FIG. 2, there are shown four bit lines BL0 to BL3, four string selection line groups SSL00 to SSL03, SSL10 to SSL13, SSL20 to SSL23, and SSL30 to SSL33, four ground selection lines GSL0 to GSL3, and four word line layers L1 to L4. But, it is well understood that the memory cell array 1100 further includes more word line layers, bit lines, and selection line groups. Four word lines WLi1 to WLi4 (i=1~4) are arranged on each of the word line layers L1 to L4 so as to be vertical to the bit lines BL0 to BL3.

One ends of word lines WLi1 to WLi4 arranged on each word line layer may be interconnected electrically and commonly. The number of commonly connected word lines may be determined variously. In FIG. 2, there is shown an example that four word lines WLi1 to WLi4 are connected electrically one another. Strings 1101 may be configured to be identical to one another. Each string 1101 is connected to a corresponding bit line via a corresponding string selection transistor and to a common source line CSL via a corresponding ground selection transistor. For example, a string 1101 is connected to a bit line BL0 via a string selection transistor controlled by a corresponding one SSL00 of a group of string selection lines SSL00 to SSL03, and to the common source line CSL via a ground selection transistor controlled by a ground selection line GSL0. A string 1101 is connected to a bit line BL1 via a string selection transistor controlled by a corresponding one SSL01 of a group of string selection lines SSL00 to SSL03, and to the common source line CSL via a ground selection transistor controlled by the ground selection line GSL0. A string 1101 is connected to a bit line BL2 via a string selection transistor controlled by a corresponding one SSL02 of a group of string selection lines SSL00 to SSL03, and to the common source line CSL via a ground selection transistor controlled by the ground selection line GSL0. A string 1101 is connected to a bit line BL3 via a string selection transistor controlled by a corresponding one SSL03 of a group of string selection lines SSL00 to SSL03, and to the common source line CSL via a ground selection transistor controlled by the ground selection line GSL0. For ease of description, interconnection on one string selection line group is described. But, strings connected with the remaining string selection line groups may be connected with the bit lines BL0 to BL3 and the common source line CSL in the same manner as described above. As understood from FIG. 2, vertical strings 1101 may be arranged in rows and columns.

As described above, memory cells (for example, memory cells connected with WL11, WL21, WL31, or WL41) of strings in one XZ plane are connected to corresponding bit lines BL0 to BL3 when string selection lines (for example, SSL00 to SSL03) of a corresponding string selection line group are activated. As will be described below, string selection lines of each string selection line group may be activated individually or simultaneously.

Figure 3:
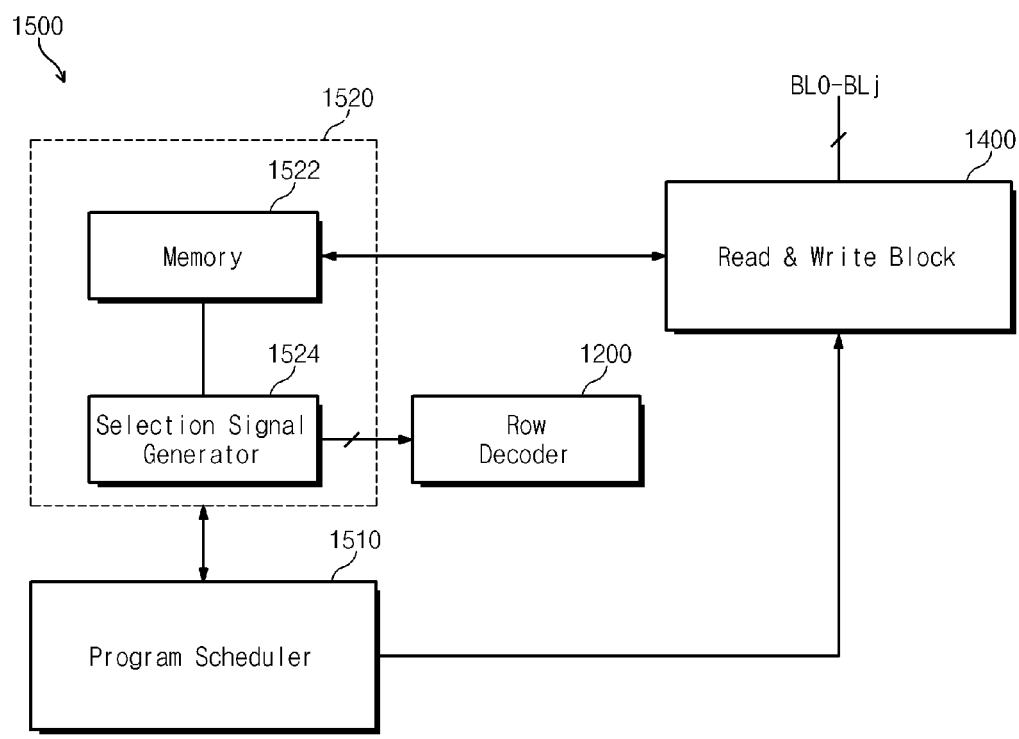
FIG. 3 is a block diagram showing control logic illustrated in FIG. 1 according to an exemplary embodiment of the inventive concept.

FIG. 3 is a block diagram showing control logic illustrated in FIG. 1 according to an exemplary embodiment of the inventive concept.

Referring to FIG. 3, control logic 1500 may include a program scheduler 1510 and a String selection line Control Unit (SCU) 1520. The program scheduler 1510 may be implemented to control a program operation of a non-volatile memory device overall. The program scheduler 1510 may control a read and write block 1400 to sequentially drive bit lines BL0 to BLj with a bit line program voltage (for example, 0V) when the bit lines BL0 to BLj are setup at each program loop. Alternatively, the program scheduler 1510 may control a read and write block 1400 to sequentially drive bit lines BL0 to BLj with a bit line program voltage (for example, 0V) regardless of data to be programmed when the bit lines BL0 to BLj are setup at each program loop. Sequential driving of the bit lines BL0 to BLj may be made after the bit lines BL0 to BLj (or, string channels) are charged to a bit line program-inhibit voltage (for example, a power supply voltage). This may be made under the state that string selection lines and/or word lines of each word line layer are activated. Alternatively, sequential driving of the bit lines BL0 to BLj is able to be made under the state that the bit lines BL0 to BLj (or, string channels) are not charged to a bit line program-inhibit voltage (for example, a power supply voltage).

The string selection line control unit 1520 is controlled by the program scheduler 1510 and may control activation of string selection signal groups (SS00~SS0j) to (SSi0~SSij) which are to be sent respectively to string selection line groups (SSL00~SSL0j) to (SSLi0~SSLij) via a row decoder circuit 120. In particular, at each program loop, all or a part of string selection lines of each string selection line group may be activated at the same time. At this time, there are inactivated string selection signals except for activated string selection signals of any string selection signal group. As illustrated in FIG. 3, the string selection line control unit 1520 may include a memory 1522 and a selection signal generator 1524.

The memory 1522 may be used to store not only data (for example, 1-page data) to be stored in memory cells connected with one word line, but also data (for example, plural page data) to be stored in memory cells connected with commonly connected word lines (for example, WLi1 to WLi4) of the same word line layer. In case of the non-volatile memory device according to an exemplary embodiment of the inventive concept, at a program operation, the memory 1522 may store data (for example, plural page data) to be stored in memory cells connected with commonly connected word lines (for example, WLi1 to WLi4) of the same word line layer. Data transferred via an input/output interface (not shown) may be stored in the memory 1522 under the control of the program scheduler 1522. It is possible to transfer all or a part of data stored in the memory 1522 into the read and write block 1400 according to the control of the program scheduler 1510. Further, it is possible to update data stored in the memory 1522 with data (for example, data read at a verify-read operation) read by the read and write block 1400 according to the control of the program scheduler 1510. The selection signal generator 1524 may activate all or a part of string selection signals of each string selection signal group corresponding to any column. This will be more fully described hereinafter.

As described above, the read and write block 1400 may drive one of bit lines BL0 to BLj with a bit line program voltage according to the control of the program scheduler 1510 whenever there are activated all or a part of string selection signals of each string selection signal group corresponding to any column. This may be repeated until the bit lines BL0 to BLj are all selected. This will be more fully described hereinafter. It is possible to program memory cells of electrically connected word lines (for example, refer to FIG. 2, WL11 to WL14) simultaneously by driving one of the bit lines BL0 to BLj with a bit line program voltage whenever there are activated all or a part of string selection signals of each string selection signal group corresponding to any column. This will be more fully described hereinafter.

In an exemplary embodiment, string selection signals of each string selection signal group may be activated simultaneously within remaining operations (for example, a verify operation, a read operation, etc.) except for a string selection line setup and bit line charging period of a program operation under the control of the program scheduler 1510. For example, a group of string selection signals SS00 to SS0j may be activated simultaneously within remaining operations (for example, a verify operation, a read operation, etc.) except for a string selection line setup and bit line charging period of a program operation under the control of the program scheduler 1510. At this time, remaining groups of string selection signals (SS10 to SS1j) to (SSi0 to SSij) may be inactivated.

Figure 4:
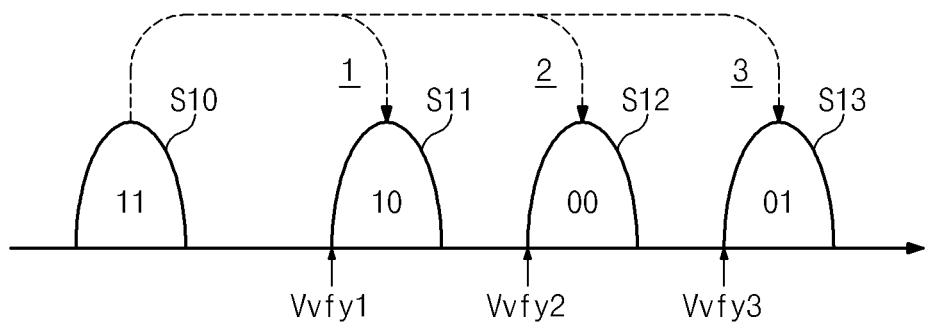
FIGS. 4 to 6 are diagrams for describing variations of threshold voltages when 2-bit data is stored in each memory cell.
Figure 5:
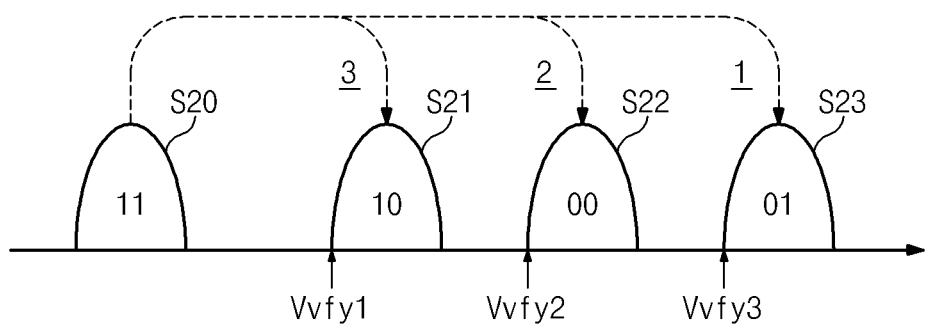
Figures 6, 7:
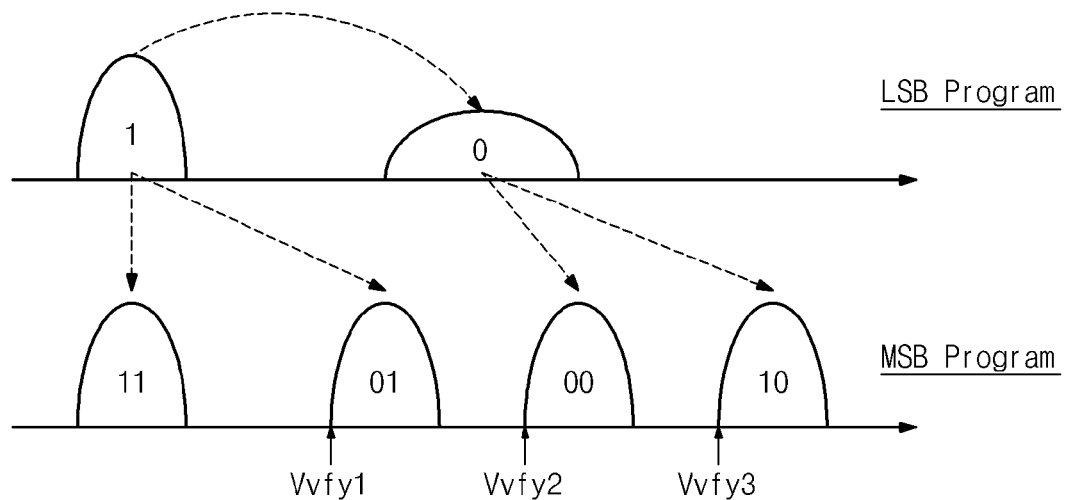
FIG. 7 is a diagram for describing selective activation of string selection signals generated by a selection signal generator in FIG. 3 according to an exemplary embodiment of the inventive concept.

FIGS. 4 to 6 are diagrams for describing variations of threshold voltages when 2-bit data is stored in each memory cell.

With an exemplary embodiment of the inventive concept, each memory cell may store m-bit data (m being 2 or more integer). Methods of storing 2-bit data in each memory cell may be implemented variously. For example, as illustrated in FIG. 4, memory cells may be programmed sequentially to program states S11, S12, and S13 from an erase state S10. The program states S11, S12, and S13 may be determined by corresponding verify voltages Vvfy1, Vvfy2, and Vvfy3. Alternatively, as illustrated in FIG. 5, memory cells may be programmed sequentially to program states S23, S22, and S21 from an erase state S10. The program states S21, S22, and S23 may be determined by corresponding verify voltages Vvfy1, Vvfy2, and Vvfy3. Still alternatively, as illustrated in FIG. 6, it is possible to store 2-bit data in memory cells through an LSB program process and an MSB program process. It is well comprehended that a manner of programming 2-bit data in each memory cell is not limited to this disclosure. It is well comprehended that a manner of programming multibit data in each memory cell is not limited to this disclosure. Further, it is well understood that the bit ordering is not limited to this disclosure.

Figure 8:
FIG. 8 is a diagram showing data stored in a memory illustrated in FIG. 3.

FIG. 7 is a diagram for describing selective activation of string selection signals generated by a selection signal generator in FIG. 3 according to an exemplary embodiment of the inventive concept, and FIG. 8 is a diagram showing data stored in a memory illustrated in FIG. 3.

A non-volatile memory device 1000 according to an exemplary embodiment of the inventive concept may be formed to simultaneously program memory cells (or, memory cell transistors) of commonly connected word lines (for example, WL11 to WL14 (refer to FIG. 2)). This may necessitate selective charging of channels of strings 1101 including memory cells of commonly connected word lines (for example, WL11 to WL14 (refer to FIG. 2)) to 0V before a program voltage is applied to the commonly connected word lines (for example, WL11 to WL14 (refer to FIG. 2)). This may be made by simultaneously activating all or a part of string selection lines of each string selection line group corresponding to any column according to data to be programmed. In an exemplary embodiment, it is assumed that memory cells are programmed sequentially to program states S23, S22, and S21 according to an order described in FIG. 5. But, it is possible to program memory cells according to orders described in FIGS. 4 and 6.

Memory cells connected with word lines WL11 to WL14 in a word line layer (for example, L1) may include memory cells to be programmed to a '01' state, memory cells to be programmed to a '00' state, and memory cells to be programmed to a '10' state and memory cells to be maintained at an erase state. With the above assumption, firstly, an operation for programming memory cells to a '01' state may be conducted. Programming of memory cells to a '01' state may necessitate charging of string channels (corresponding to memory cells to be programmed to a '01' state) to a voltage of 0V before a program voltage is applied to commonly connected word lines (for example, WL11 to WL14 (refer to FIG. 2)).

In order to charge string channels to a voltage of 0V, a selection signal generator 1524 simultaneously activates string selection lines corresponding to memory cells to be programmed to a '01' state, upon data values of each column stored in a memory 1522. At this time, the selection signal generator 1524 inactivates string selection lines corresponding to memory cells to be programmed to remaining states. For example, referring to FIG. 8, the selection signal generator 1524 simultaneously activates string selection lines (for example, SSL00 and SSL30) corresponding to memory cells (for example, memory cells appointed by BL0 and WL11 and BL0 and WL14) to be programmed to a '01' state, upon data values (for example, data values 01, 10, 00, and 01 to be stored in memory cells appointed by a bit line BL0 and string selection lines SSL00, SSL10, SSL20, and SSL30) of each column stored in the memory 1522. At this time, the selection signal generator 1524 inactivates string selection lines SSL10 and SSL20 corresponding to memory cells to be programmed to remaining states 11, 10, and 00. This means that string selection lines SSL00 and SSL30 corresponding to selection signals SS00 and SS30 are activated and string selection lines SSL10 and SSL20 corresponding to selection signals SS10 and SS20 are inactivated.

Likewise, the selection signal generator 1524 simultaneously activates string selection lines (for example, SSL01 and SSL21) corresponding to memory cells (for example, memory cells appointed by BL1 and WL11 and BL1 and WL13) to be programmed to a '01' state, upon data values (for example, data values 01, 10, 00, and 01 to be stored in memory cells appointed by a bit line BL1 and string selection lines SSL01, SSL11, SSL21, and SSL31) of each column stored in the memory 1522. At this time, the selection signal generator 1524 inactivates string selection lines SS11 and SS31 corresponding to memory cells to be programmed to remaining states 11, 10, and 00. This means that string selection lines SSL01 and SSL21 corresponding to selection signals SS01 and SS21 are activated and string selection lines SSL11 and SSL31 corresponding to selection signals SS11 and SS31 are inactivated. Activation of string selection lines associated with each of remaining bit lines may be made in the same manner as described above.

As understood from the above description, simultaneous activation of string selection lines may be made in a bit line unit. That is, string selection lines corresponding to memory cells to be programmed to any state may be activated at the same time. A bit line may be driven with a ground voltage at the above-described state. This means that channels of strings including memory cells to be programmed to any state are charged to a voltage of 0V. A program voltage may be supplied to a commonly connection word lines after all bit lines are driven sequentially according to the above-described manner. That is, a program operation may be executed.

After there is completed a program operation on the '01' state, an operation of programming memory cells to a '00' state may be carried out. Programming of memory cells to a '00' state may be made in the same manner as described on the basis of the '01' state, and description thereof is thus omitted. Finally, after there is completed a program operation on the '00' state, an operation of programming memory cells to a '10' state may be carried out. Programming of memory cells to a '10' state may be made in the same manner as described on the basis of the '01' state, and description thereof is thus omitted.

In an exemplary embodiment, data in each row/word line may form page data.

Figure 9:
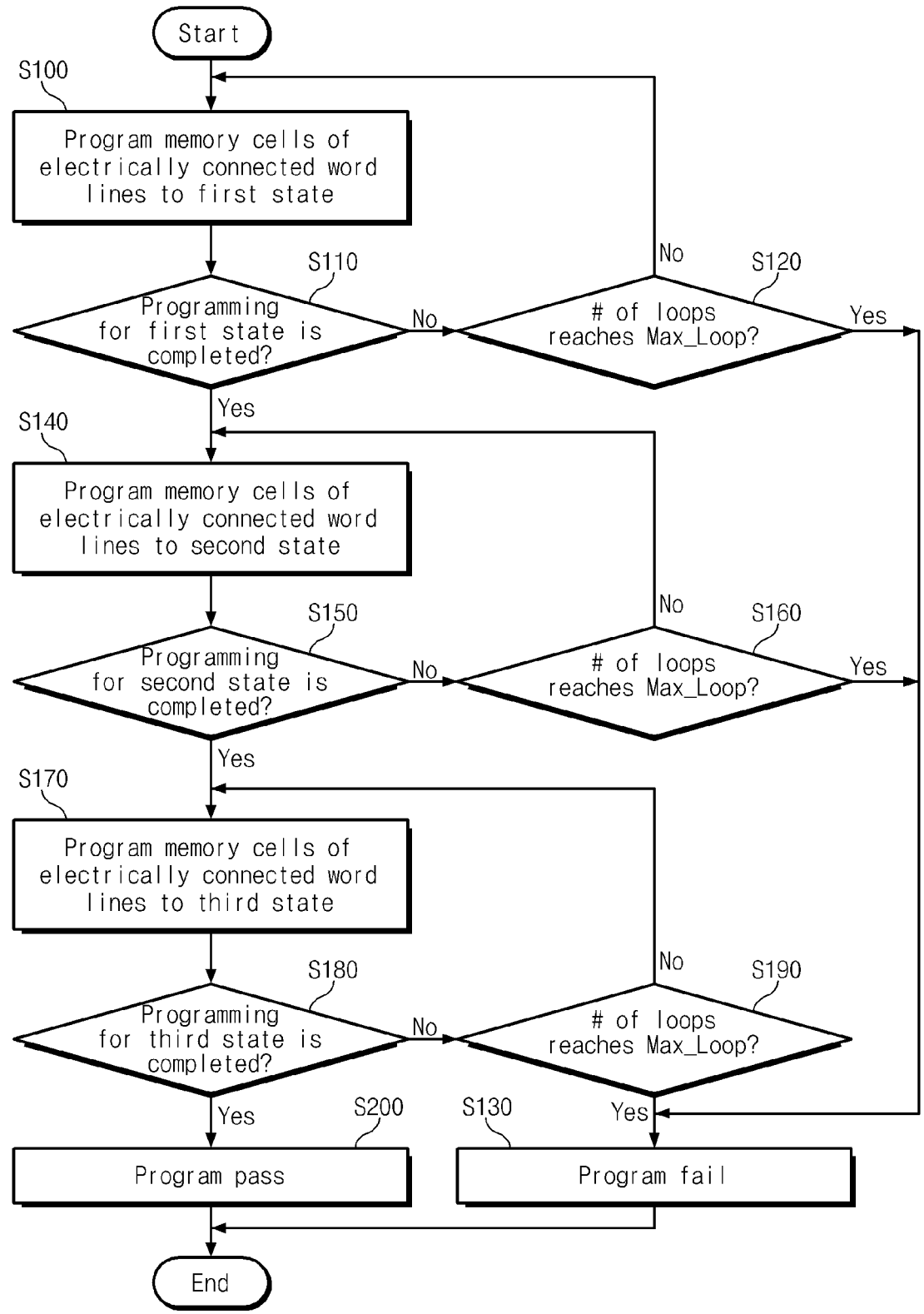
FIG. 9 is a flow chart for describing a program method of a non-volatile memory device according to an exemplary embodiment of the inventive concept.
Figure 10:
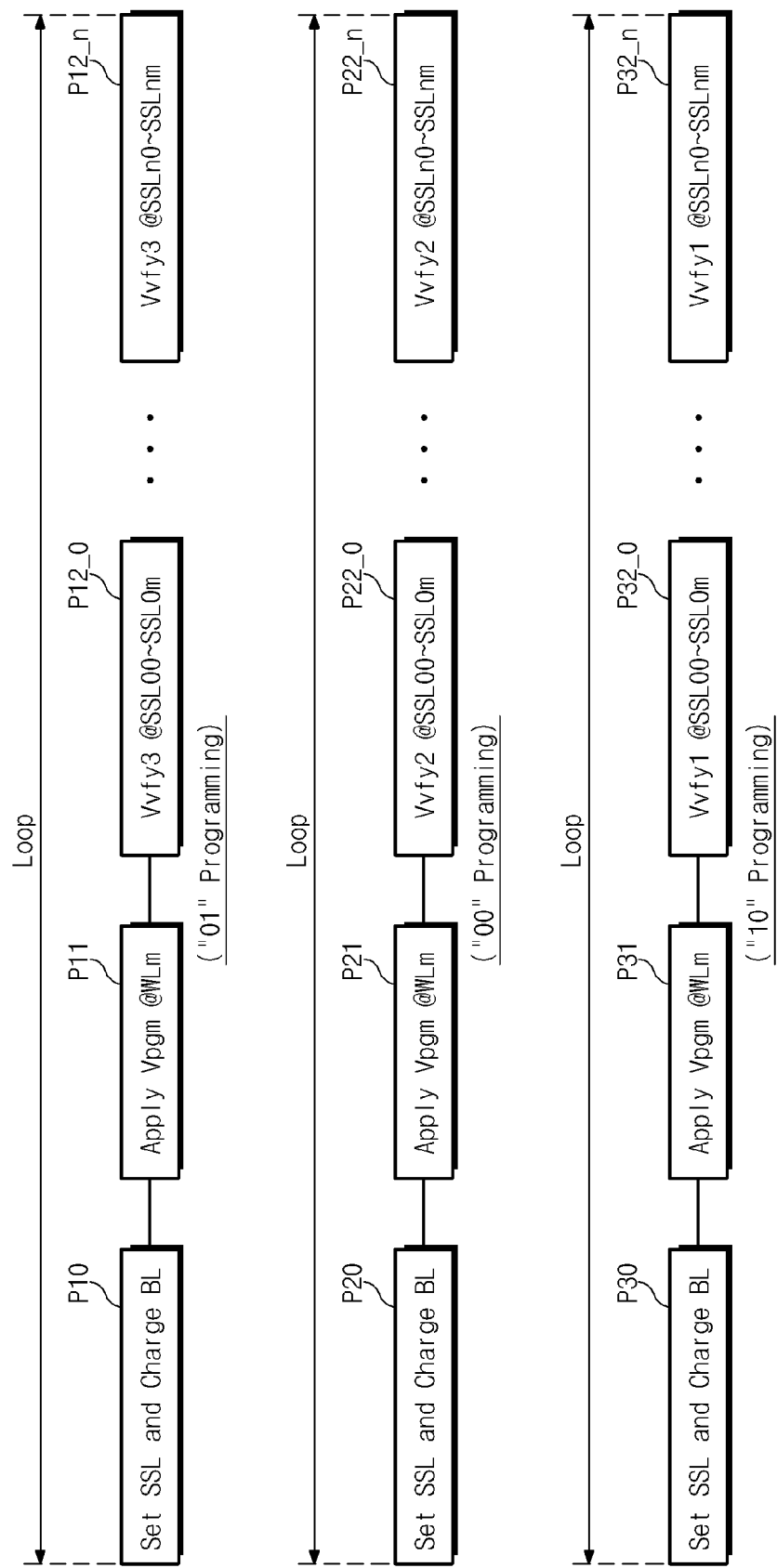
FIG. 10 is a diagram showing program loops related to each of programmed states.
Figure 11:
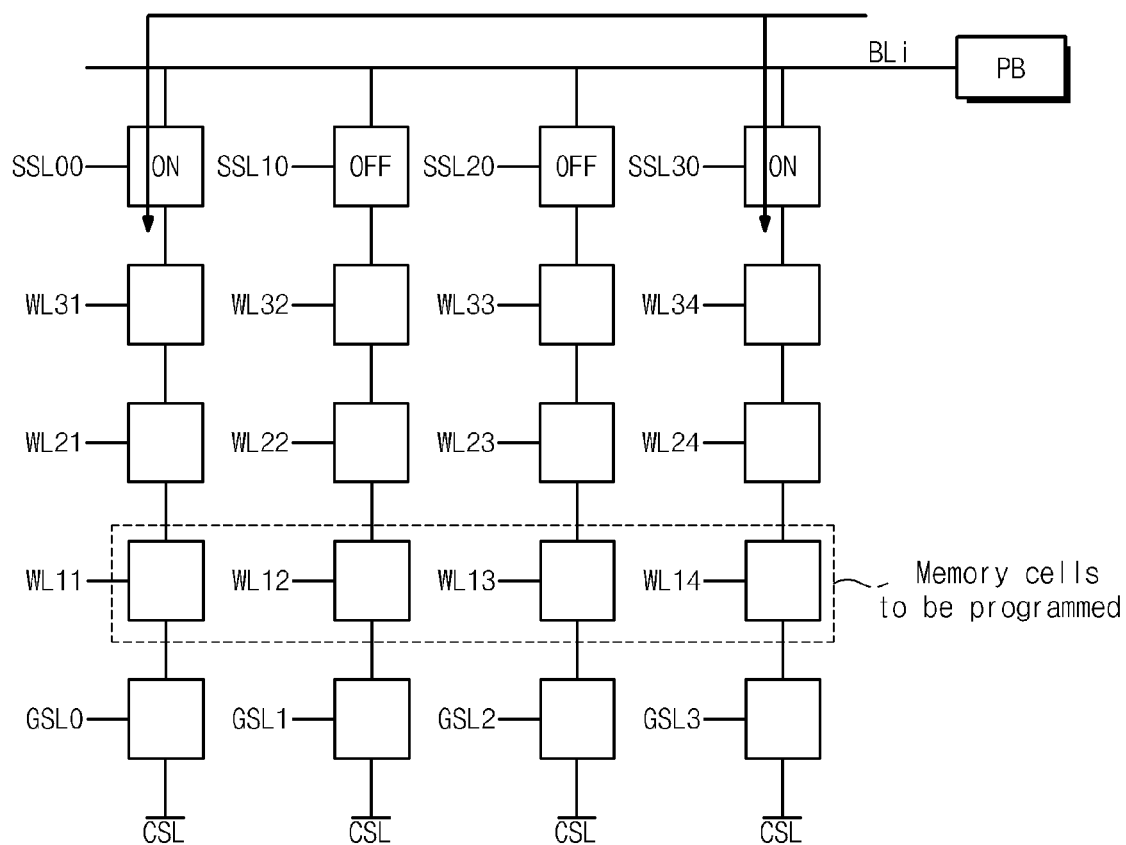
FIGS. 11 to 13 are diagrams showing selective activation of string selection lines related to each of programmed states.
Figure 12:
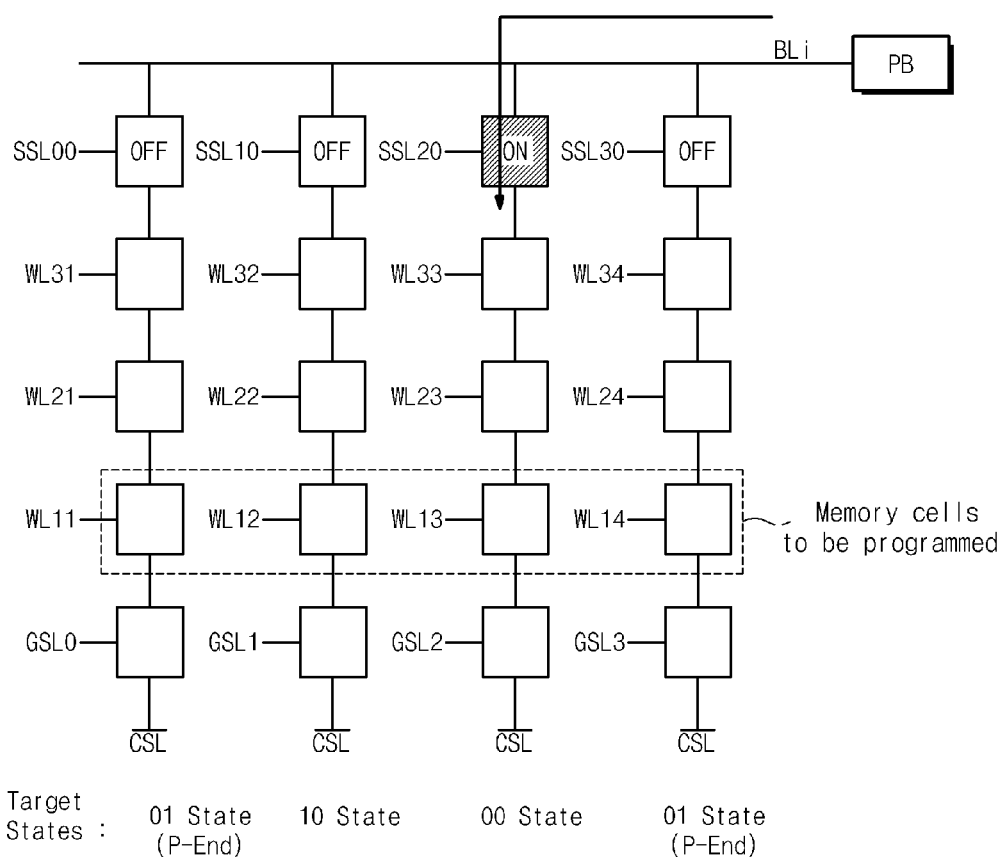
Figure 13:
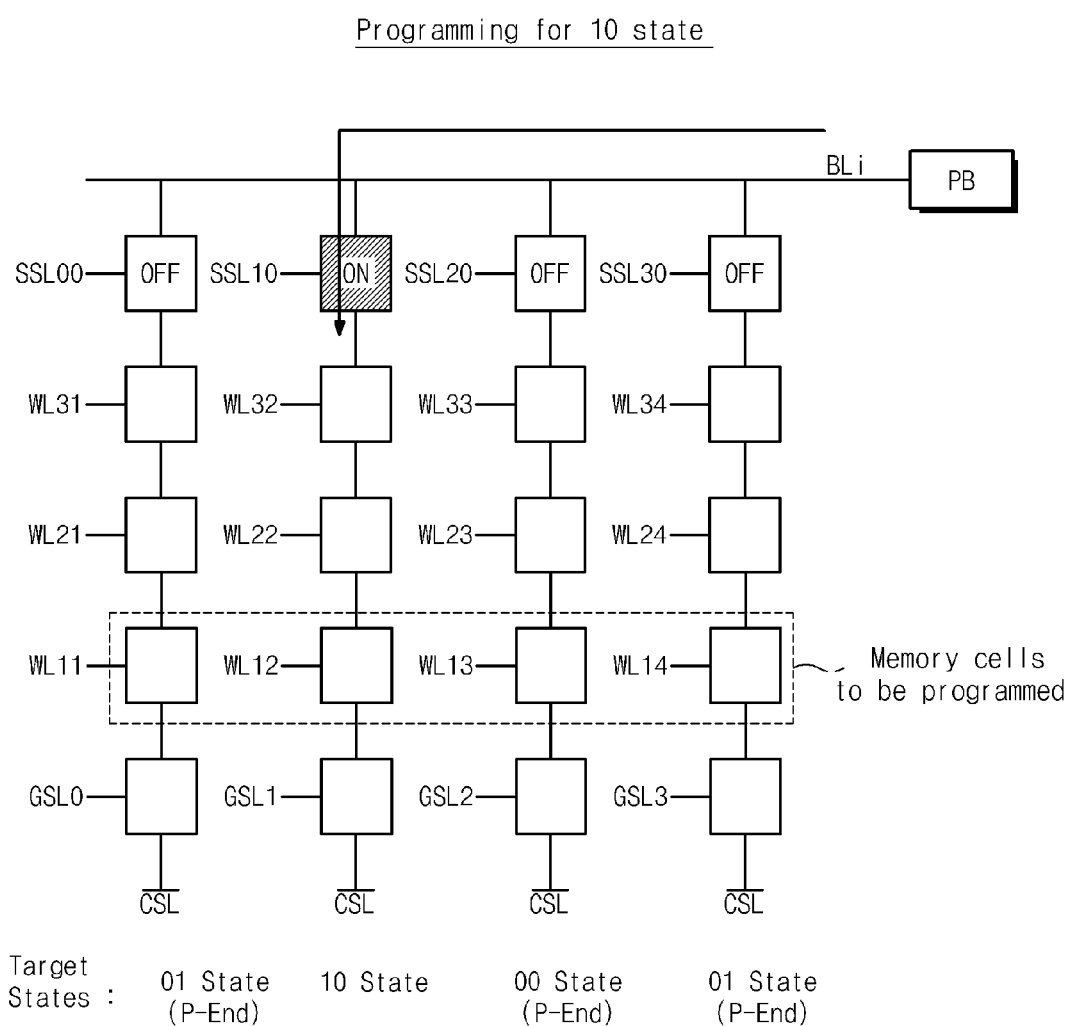

FIG. 9 is a flow chart for describing a program method of a non-volatile memory device according to an exemplary embodiment of the inventive concept, FIG. 10 is a diagram showing program loops related to each of programmed states, and FIGS. 11 to 13 are diagrams showing selective activation of string selection lines related to each of programmed states. Below, a program method of a non-volatile memory device according to an exemplary embodiment of the inventive concept will be more fully described with reference to accompanying drawings.

Prior to describing a program method according to an exemplary embodiment of the inventive concept, it is assumed that word lines arranged on each word line layer may constitute at least one group and word lines (for example, four word lines WL11 to WL14) in the at least one group are connected electrically to one another. But, it is well comprehended that word lines arranged on each word line layer are divided into a plurality of groups. Further, it is well comprehended that the number of word lines in a group may be changed so that groups of word lines (such as read or write blocks) may have varying sizes. Simultaneous activation of string selection lines may be controlled by a group unit. It is assumed that six bit lines BL0 to BL5 are arranged in a memory cell array 1100 and data to be stored simultaneously in memory cells of commonly connected word lines is identical to that illustrated in FIG. 8.

First of all, in operation S100, memory cells of electrically connected word lines WL11 to WL14 may be programmed simultaneously to the first state (for example, a '01' state in FIG. 5). This will be more fully described with reference to FIGS. 10 and 11. Referring to FIG. 10, the '01' programming may be carried out via a plurality of program loops, each of which includes a string selection line setup and bit line charge period P10, a program execution period P11, and a plurality of verify periods P12_0 to P12_n (in an exemplary embodiment, n=3).

During the string selection line setup and bit line charge period P10, a selection signal generator 1524 of a string selection line control unit 1520 may simultaneously activate string selection signals (corresponding to any column) of each string selection signal group, upon data stored in a memory 1522. For example, referring to FIG. 8, the selection signal generator 1524 may simultaneously activate string selection signals (for example, SS00 and SS30) to be connected to a bit line BL0 and corresponding to memory cells to be programmed to a '01' state. The activated string selection signals SS00 and SS30 may be transferred to corresponding string selection lines SSL00 and SSL30 via a row decoder circuit 1200, respectively. This means that selection transistors respectively connected by the string selection lines SSL00 and SSL30 are turned on, as illustrated in FIG. 11. A bit line BL0 is charged to a voltage of 0V via a page buffer PB under the control of a program scheduler 1510, with selection transistors respectively connected by the string selection lines SSL00 and SSL30 being turned on. That is, channels of strings may be charged via turned-on selection transistors. After channels of strings are charged to 0V via turned-on selection transistors, the bit line BL0 may be isolated from the page buffer PB0. After selective charging of strings connected with the bit line BL0 is made, there may be made selective charging of strings connected with a bit line BL1. Selective charging of strings connected with the bit line BL1 may be made in the same manner as described above. Likewise, selective charging of strings connected with each of remaining bit lines may be made in the same manner as described above.

As a result, channels of strings including memory cells (connected with electrically connected word lines WL11 to WL14) to be programmed to a '01' state may be charged to a voltage of 0V through activation of string selection lines (SSL00~SSL05) to (SSL30~SSL35) and sequential driving of bit lines BL0 to BL5.

Once channels of strings including memory cells (connected with electrically connected word lines WL11 to WL14) to be programmed to a '01' state are charged to a voltage of 0V, a program voltage may be supplied to the electrically connected word lines WL11 to WL14 during the program execution period P11. That is, a program operation may be executed. When a program operation is executed, all string selection lines may be inactivated. Following the program execution period P11, a verify operation may be performed by a string selection line unit. This will be more fully described below.

Referring to FIG. 10, during a verify period P12_0, there may be carried out a verify operation on selected memory cells (for example, memory cells connected with WL11) of strings connected with the string selection lines SSL00 to SSL05. At the verify operation, a verify voltage Vvfy3 for verifying a '01' state may be applied to the electrically connected word lines WL11 to WL14. At this time, since string selection lines (SSL10~SSL15) to (SSL30~SSL35) are inactivated, a verify operation may be conducted with respect to memory cells connected with the word line WL11. That is, a read and write block 1400 reads data from memory cells connected with the word line WL11 via bit lines BL0 to BL5. '01' values of data values (data values to be stored in memory cells in WL11) stored in a memory 1522 may be changed into a pass value (a '11' value) according to the read data values under the control of the program scheduler 1510. This is to inhibit a program operation of program-completed memory cells at a following program loop. In a following verify period P12_1, a verify operation may be carried out with respect to selected memory cells of strings connected with string selection lines SSL10 to SSL15, which will be carried out in the same manner as described above. Likewise, verify operations of remaining verify periods P12_2 to P12_3 will be carried out in the same manner as described above.

Returning to FIG. 9, in operation S110, it is determined whether a program operation on the first state (a '01' state) is completed. If a program operation on the first state (a '01' state) is determined not to be completed, the procedure goes to operation S120, in which it is determined whether a program loop number reaches a maximum program loop corresponding to the first state. If a program loop number is determined not to reach a maximum program loop corresponding to the first state, the procedure goes to operation S100. A program voltage may increase by a given increment at a next program loop. If a program loop number is determined to reach a maximum program loop corresponding to the first state, the procedure goes to operation S130, in which a program operation is treated as program fail.

If a program operation on the first state (a '01' state) is determined to be completed in operation S110, the procedure goes to operation S140, in which memory cells of the electrically connected word lines WL11 to WL14 may be programmed to the second state (for example, a '00' state in FIG. 5) at the same time. Referring to FIG. 10, each program loop includes a string selection line setup and bit line charge period P20, a program execution period P21, and a plurality of verify periods P22_0 to P22_n (in an exemplary embodiment, n=3).

During the string selection line setup and bit line charge period P20, the selection signal generator 1524 of the string selection line control unit 1520 may activate string selection signals (SS00~SS05) to (SS30~SS35) selectively, upon data stored in the memory 1522. For example, referring to FIG. 8, the selection signal generator 1524 may activate a string selection signal (for example, SS20) to be connected to a bit line BL0 and corresponding to a memory cell to be programmed to a '00' state. The activated string selection line SS20 may be transferred to a corresponding string selection line SSL20 via the row decoder circuit 1200. This means that a selection transistor connected by the string selection line SSL20 is turned on, as illustrated in FIG. 12. A bit line BL0 is charged to a voltage of 0V via a page buffer PB under the control of a program scheduler 1510, with a selection transistor connected by the string selection line SSL20 being turned on. That is, a channel of a string may be charged via a turned-on selection transistor. After a channel of a string is charged to 0V via the turned-on selection transistor, the bit line BL0 may be isolated from the page buffer PB0. After selective charging of a string connected with the bit line BL0 is made, there may be made selective charging of strings connected with a bit line BL1. Selective charging of strings connected with the bit line BL1 may be made in the same manner as described above. Likewise, selective charging of strings connected with each of remaining bit lines may be made in the same manner as described above.

As a result, channels of strings including memory cells (connected with electrically connected word lines WL11 to WL14) to be programmed to a '00' state may be charged to a voltage of 0V through activation of string selection lines (SSL00~SSL05) to (SSL30~SSL35) and sequential driving of bit lines BL0 to BL5.

Once channels of strings including memory cells (connected with electrically connected word lines WL11 to WL14) to be programmed to a '00' state are charged to a voltage of 0V, a program voltage may be supplied to the electrically connected word lines WL11 to WL14 during the program execution period P21. That is, a program operation may be executed. Following the program execution period P21, a verify operation may be performed by a string selection line unit. This will be more fully described below.

During a verify period P22_0, there may be carried out a verify operation on selected memory cells connected with the string selection lines SSL00 to SSL05. At the verify operation, a verify voltage Vvfy2 for verifying a '00' state may be applied to the electrically connected word lines WL11 to WL14. At this time, since string selection lines (SSL10~SSL15) to (SSL30~SSL35) are inactivated, a verify operation may be conducted with respect to memory cells connected with the word line WL11. That is, the read and write block 1400 reads data from memory cells connected with the word line WL11 via the bit lines BL0 to BL5. '00' values of data values (data values to be stored in memory cells in WL11) stored in the memory 1522 may be changed into a pass value (i.e., a '11' value) according to the read data values under the control of the program scheduler 1510. This is to inhibit a program operation of program-completed memory cells at a following program loop. In a following verify period P22_1, a verify operation may be carried out with respect to selected memory cells of strings connected with string selection lines SSL10 to SSL15, which will be carried out in the same manner as described above. Likewise, verify operations of remaining verify periods P22_2 to P22_3 will be carried out in the same manner as described above.

Returning to FIG. 9, in operation S150, it is determined whether a program operation on the second state (i.e., a '00' state) is completed. If a program operation on the second state is determined not to be completed, the procedure goes to operation S160, in which it is determined whether a program loop number reaches a maximum program loop number, or program loop limit, corresponding to the second state. If a program loop number is determined not to reach a maximum program loop corresponding to the second state, the procedure goes to operation S140. A program voltage may increase by a given increment at a next program loop. If a program loop number is determined to reach a maximum program loop corresponding to the second state, the procedure goes to operation S130, in which a program operation is treated as program fail.

If a program operation on the second state is determined to be completed in operation S150, the procedure goes to operation S170, in which memory cells of the electrically connected word lines WL11 to WL14 may be programmed to the third state (for example, a '10' state in FIG. 5) at the same time. Referring to FIG. 10, the '10' programming may be executed via a plurality of program loops, each of which includes a string selection line setup and bit line charge period P30, a program execution period P31, and a plurality of verify periods P32_0 to P32_n (in an exemplary embodiment, n=3).

During the string selection line setup and bit line charge period P20, the selection signal generator 1524 of the string selection line control unit 1520 may activate string selection signals selectively, upon data stored in the memory 1522. For example, referring to FIG. 8, the selection signal generator 1524 may activate a string selection signal (for example, SS10) to be connected to a bit line BL0 and corresponding to memory cells to be programmed to a '10' state. The activated string selection signal SS10 may be transferred to a corresponding string selection line SSL10 via the row decoder circuit 1200. This means that a selection transistor connected by the string selection line SSL10 is turned on, as illustrated in FIG. 13. A bit line BL0 is charged to a voltage of 0V via a page buffer PB under the control of the program scheduler 1510, with a selection transistor connected by the string selection line SSL10 being turned on. That is, a channel of a string may be charged via the turned-on selection transistor. After the channel of the string is charged to 0V via the turned-on selection transistor, the bit line BL0 may be isolated from the page buffer PB0. After selective charging of strings connected with the bit line BL0 is made, there may be made selective charging of strings connected with a bit line BL1. Selective charging of strings connected with the bit line BL1 may be made in the same manner as described above. Likewise, selective charging of strings connected with each of remaining bit lines may be made in the same manner as described above.

As a result, channels of strings including memory cells (connected with electrically connected word lines WL11 to WL14) to be programmed to a '10' state may be charged to a voltage of 0V through activation of string selection lines (SSL00~SSL05) to (SSL30~SSL35) and sequential driving of bit lines BL0 to BL5.

Once channels of strings including memory cells (connected with electrically connected word lines WL11 to WL14) to be programmed to a '10' state are charged to a voltage of 0V, a program voltage may be supplied to the electrically connected word lines WL11 to WL14 during the program execution period P31. That is, a program operation may be executed. Following the program execution period P31, a verify operation may be performed by a string selection line unit. This will be more fully described below.

During a verify period P32_0, there may be carried out a verify operation on selected memory cells of strings connected with the string selection lines SSL00 to SSL05. At the verify operation, a verify voltage Vvfy1 for verifying a '10' state may be applied to the electrically connected word lines WL11 to WL14. At this time, since string selection lines (SSL10~SSL15) to (SSL30~SSL35) are inactivated, a verify operation may be conducted with respect to memory cells connected with the word line WL11. That is, the read and write block 1400 reads data from memory cells connected with the word line WL11 via bit lines BL0 to BL5. '10' values of data values (data values to be stored in memory cells in WL11) stored in the memory 1522 may be changed into a pass value (i.e., a '11' value) according to the read data values under the control of the program scheduler 1510. This is to inhibit a program operation of program-completed memory cells at a following program loop. In a following verify period P32_1, a verify operation may be carried out with respect to selected memory cells of strings connected with string selection lines SSL10 to SSL15, which will be carried out in the same manner as described above. Likewise, verify operations of remaining verify periods P32_2 to P32_3 will be carried out in the same manner as described above.

Returning to FIG. 9, in operation S180, it is determined whether a program operation on the third state (a '10' state) is completed. If a program operation on the third state (a '10' state) is determined not to be completed, the procedure goes to operation S190, in which it is determined whether a program loop number reaches a maximum program loop corresponding to the third state. If a program loop number is determined not to reach a maximum program loop corresponding to the third state, the procedure goes to operation S170. A program voltage may increase by a given increment at a next program loop. If a program loop number is determined to reach a maximum program loop corresponding to the third state, the procedure goes to operation S130, in which a program operation is treated as program fail. Referring to operation S180, if a program operation on the third state (a '10' state) is determined to be completed, the procedure goes to operation S120, in which a program operation is treated as program pass.

In an exemplary embodiment, channels of strings connected to each bit line may be charged to a power supply voltage prior to driving each bit line with 0V. But, channels of strings connected to each bit line may be maintained at a floating state prior to driving each bit line with 0V.

In an exemplary embodiment, a start level of a program voltage needed to program a current state may be set to be lower than a final level of a program voltage used to program a previous state. But, a start level of a program voltage needed to program a current state is able to be set to be identical to a final level of a program voltage used to program a previous state.

In an exemplary embodiment, a program method according to an exemplary embodiment of the general inventive concept may be applied identically to a memory cell having the program characteristics described in FIG. 4. Likewise, a program method according to an exemplary embodiment of the general inventive concept may be applied to a memory cell having the program characteristics described in FIG. 6. String selection lines are selectively activated according to 1-bit data at LSB programming, while they are selectively activated according to data (LSB data) read via an initial read operation and externally provided MSB data, at MSB programming. The LSB and MSB data may be stored in the memory 1522.

FIG. 14 is a diagram to describe a program method of a non-volatile memory device according to another exemplary embodiment of the present general inventive concept.

Referring to FIG. 14, before program loops for programming the first state are terminated, program loops for programming the second state may be executed. That is, program and verify operations for the first state may be conducted at the same time with program and verify operations for the second state. Likewise, before program loops for programming the second state are terminated, program loops for programming the third state may be executed. That is, program and verify operations for the second state may be conducted at the same time with program and verify operations for the third state. As illustrated in FIG. 14, while memory cells of commonly connected word lines are programmed to the first to third states, a program voltage Vpgm may increase according to a given slope. Memory cells of commonly connected word lines may be programmed in the same manner as described in FIG. 9 during remaining periods except for periods B100 and B110 in which program and verify operations for two states are performed at the same time.

Simultaneous activation of string selection lines conducted at each of the periods B100 and B110 may be made differently from that described in FIG. 9. For example, it is assumed that the first state is '10', the second state is '00', and the third state is '01'. During the period B100, program and verify operations are simultaneously performed with respect to the first and second states '10' and '00'. During the period B110, program and verify operations are simultaneously performed with respect to the second and third states '00' and '01'. This will be more fully described with reference to FIGS. 15 and 16. During the period B100 in which the first and second states are programmed at the same time, a verify operation for the first state may be terminated automatically at a predetermined program loop. During the period B110 in which the second and third states are programmed at the same time, a verify operation for the second state may be terminated automatically at a predetermined program loop. Likewise, a verify operation for the third state may be terminated automatically at a predetermined program loop.

Figure 15:
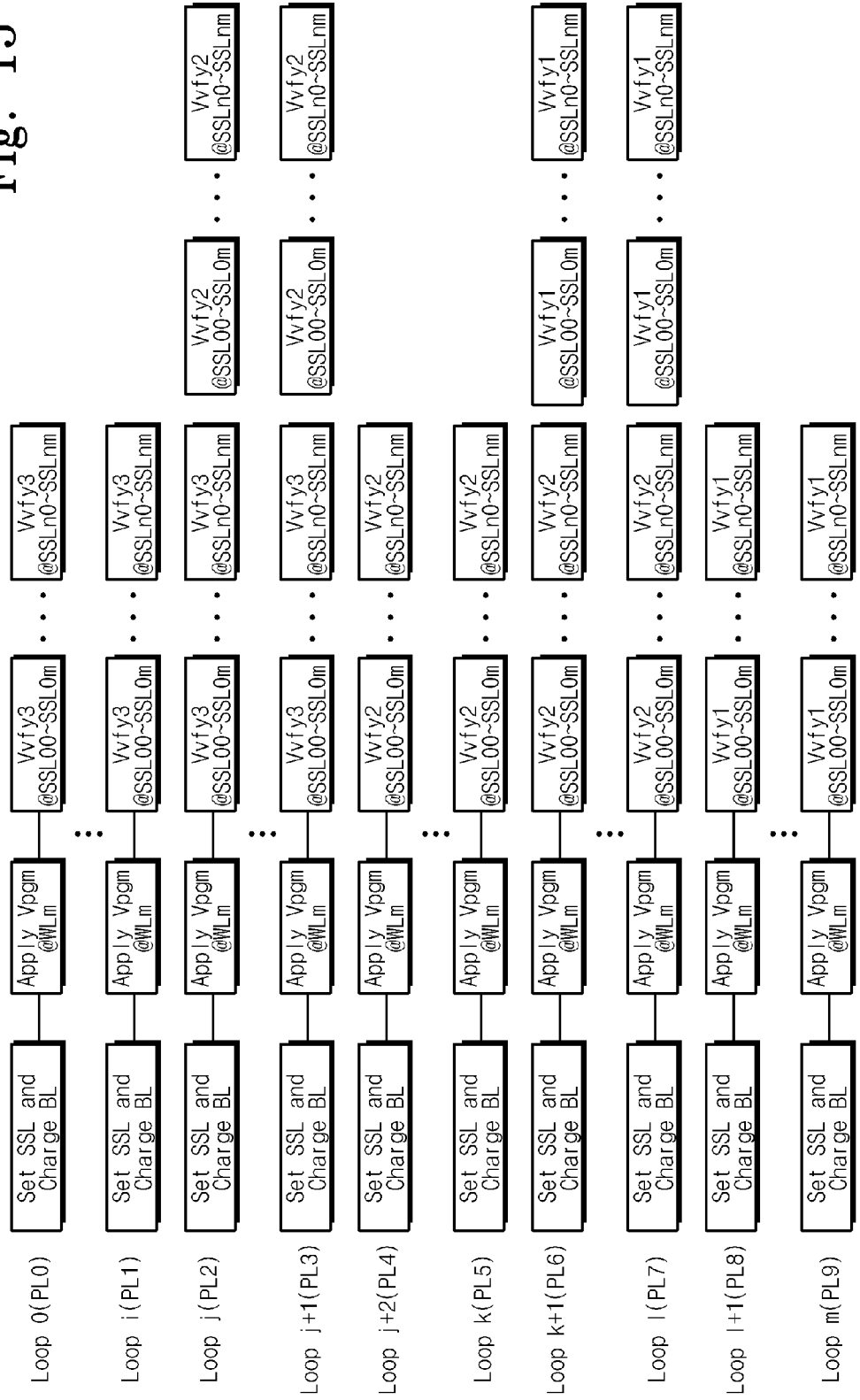
FIG. 15 is a diagram for describing one embodiment of a program method described in FIG. 14.

FIG. 15 is a diagram to illustrate one embodiment of a program method described in FIG. 14. Prior to describing a program method, it is assumed that word lines arranged on each word line layer constitute at least one group and word lines (for example, four word lines WL11 to WL14) in the at least one group are connected electrically one another. Further, it is assumed that six bit lines BL0 to BL5 is arranged in a memory cell array 1100 and data to be programmed simultaneously is identical to that shown in FIG. 8.

Referring to FIG. 15, memory cells of commonly connected word lines are programmed to the first state through a plurality of program loops PL0 to PL1, each of which includes a string selection setup and bit line charging period, a program execution period, and a plurality of verify periods. The periods in each of the program loops PL0 to PL1 are identical to those described in FIG. 10, and description thereof is thus omitted.

Within program loops PL2 to PL3, there is made simultaneous programming into the first and second states. This will be more fully described below. During a string selection line setup and bit line charging period of each of the program loops PL2 to PL3, a selection signal generator 1524 of a string selection line control unit 1520 selectively activates string selection signals of string selection signal groups according to data stored in a memory 1522. For example, referring to FIG. 8, the selection signal generator 1524 simultaneously activates string selection signals (for example, SS00, SS20, SS30) which are to be connected to a bit line BL0 and correspond to memory cells to be programmed to the first and second states (for example, '01' and '00'). The activated string selection signals SS00, SS20, and SS30 may be transferred to corresponding string selection lines SSL00, SSL20, and SSL30 via a row decoder circuit 1200, respectively. This means that selection transistors controlled by the SSL00, SSL20, and SSL30 are turned on. A bit line BL0 is charged to a voltage of 0V via a page buffer PB under the control of a program scheduler 1510, with selection transistors controlled by the SSL00, SSL20, and SSL30 being turned on. That is, channels of strings may be charged to 0V through the turned-on selection transistors. The bit line BL0 is isolated from the page buffer PB after channels of strings are charged to 0V through the turned-on selection transistors. Selective charging of strings connected with a bit line BL1 may be made following selective charging of strings connected with a bit line BL0. Selective charging of strings connected with a bit line BL1 may be made in the same manner as described above. Likewise, selective channel charging related to each of remaining bit lines BL2 to BL5 may be made in the same manner as above described.

As a result, channels of strings including memory cells (connected with electrically connected word line WL11 to WL14) to be programmed to '01' and '00' states may be charged to a voltage of 0V via activation of string selection lines and sequential driving of bit lines BL0 to BL5.

Once channels of strings including memory cells (connected with electrically connected word line WL11 to WL14) to be programmed to '01' and '00' states may be charged to a voltage of 0V, a program voltage is supplied to the electrically connected word lines WL11 to WL14 during a program execution period. That is, a program operation may be executed. Following the program execution period, verify operations for the '01' and '00' states are continuously carried out using verify voltages Vvfy3 and Vvfy2 as illustrated in FIG. 15. Verify operations of the '01' and '00' states may be made sequentially at a state where string selection line groups are activated sequentially. A verify operation is carried out to be identical to that described in FIG. 10, and description thereof is thus omitted.

After the program loop PL3, program and verify operations for the '01' state are not carried out. That is, program and verify operations for the '01' state may be terminated automatically after a predetermined program loop number.

Memory cells of commonly connected word lines are programmed to the second state through a plurality of program loops PL4 to PL5, each of which includes a string selection setup and bit line charging period, a program execution period, and a plurality of verify periods. The periods in each of the program loops PL0 to PL1 are identical to those described in FIG. 10, and description thereof is thus omitted.

Within program loops PL6 to PL7, there is made simultaneous programming into the second and third states. This will be more fully described below. During a string selection line setup and bit line charging period of each of the program loops PL6 to PL7, the selection signal generator 1524 of the string selection line control unit 1520 selectively activates string selection signals of string selection signal groups according to data stored in a memory 1522. For example, referring to FIG. 8, the selection signal generator 1524 simultaneously activate string selection signals (for example, SS10, SS20) which are to be connected to a bit line BL0 and correspond to memory cells to be programmed to the second and third states (for example, '00' and '10'). The activated string selection signals SS10 and SS20 may be transferred to corresponding string selection lines SSL10 and SSL20 via the row decoder circuit 1200, respectively. This means that selection transistors controlled by the SSL10 and SSL20 are turned on. A bit line BL0 is charged to a voltage of 0V via a page buffer PB under the control of the program scheduler 1510, with selection transistors controlled by the SSL10 and SSL20 being turned on. That is, channels of strings may be charged to 0V through the turned-on selection transistors. The bit line BL0 is isolated from the page buffer PB after channels of strings are charged to 0V through the turned-on selection transistors. Selective charging of strings connected with a bit line BL1 may be made following selective charging of strings connected with a bit line BL0. Selective charging of strings connected with a bit line BL1 may be made in the same manner as described above. Likewise, selective channel charging related to each of remaining bit lines BL2 to BL5 may be made in the same manner as above described.

As a result, channels of strings including memory cells (connected with electrically connected word line WL11 to WL14) to be programmed to the second and third states may be charged to a voltage of 0V via activation of string selection lines and sequential driving of bit lines BL0 to BL5.

Once channels of strings including memory cells (connected with electrically connected word line WL11 to WL14) to be programmed to the second and third states may be charged to a voltage of 0V, a program voltage is supplied to the electrically connected word lines WL11 to WL14 during a program execution period. That is, a program operation may be executed. Following the program execution period, verify operations for the second and third states are continuously carried out using verify voltages Vvfy2 and Vvfy1 as illustrated in FIG. 15. Verify operations of the second and third states may be made sequentially at a state where string selection line groups are activated sequentially. A verify operation is carried out to be identical to that described in FIG. 10, and description thereof is thus omitted.

After the program loop PL7, program and verify operations for the second state are not carried out. That is, program and verify operations for the second state may be terminated automatically after a predetermined program loop number.

Memory cells of commonly connected word lines are programmed to the third state through a plurality of program loops PL8 to PL9, each of which includes a string selection setup and bit line charging period, a program execution period, and a plurality of verify periods. The periods in each of the program loops PL8 to PL9 are identical to those described in FIG. 10, and description thereof is thus omitted.

Figure 16:
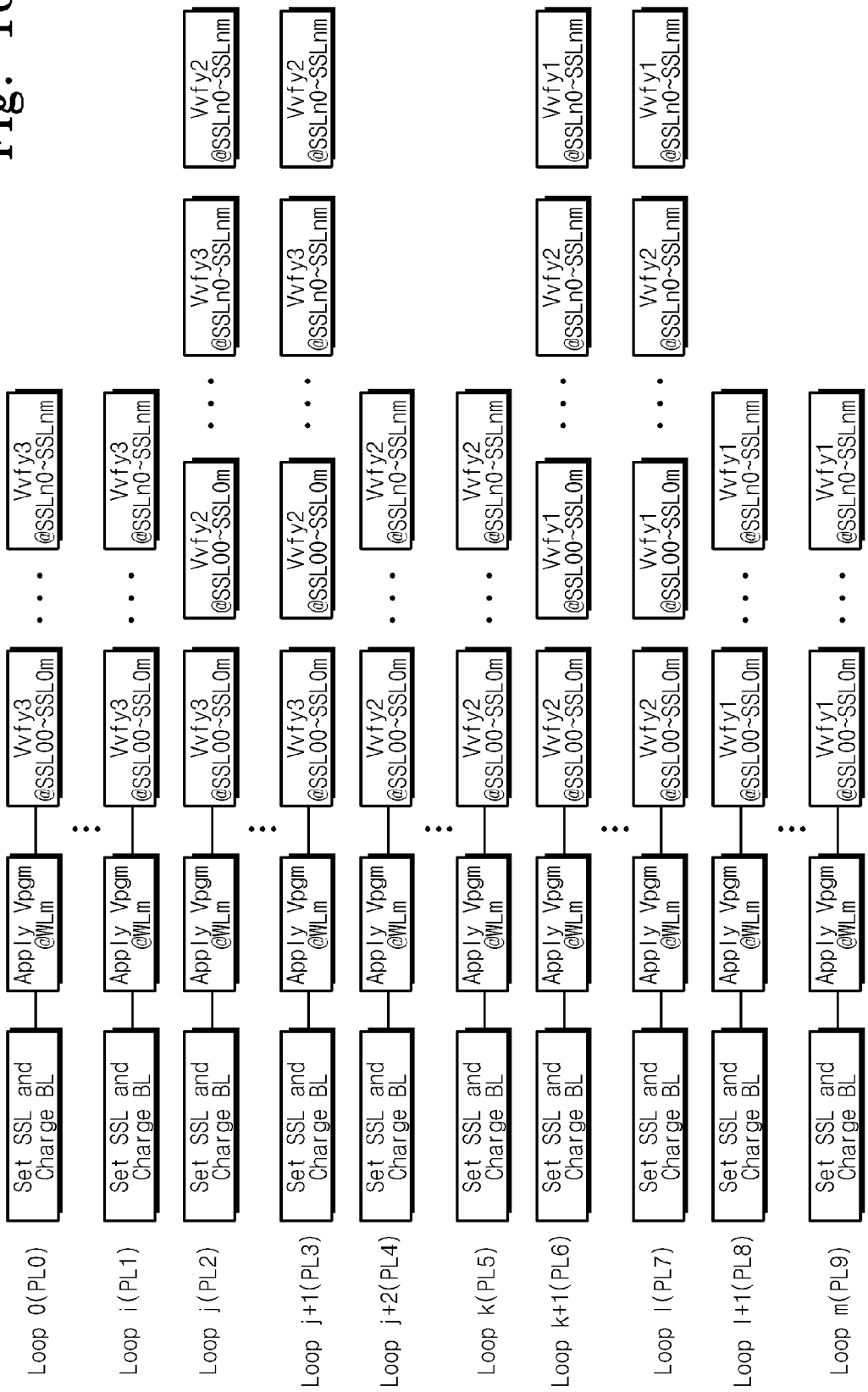
FIG. 16 is a diagram for describing another embodiment of a program method describing in FIG. 14.

FIG. 16 is a diagram to illustrate another embodiment of a program method described in FIG. 14. An embodiment illustrated in FIG. 16 is substantially identical to that illustrated in FIG. 15, excepting for the difference described below.

Referring to program loops PL2 and PL3 in which the first and second states are programmed simultaneously, verify operations of the first and second states may be made continuously with one string selection line being activated continuously. For example, a verify operation using a verify voltage Vvfy3 of the first state and a verify operation using a verify voltage Vvfy2 of the second state are carried out continuously when a string selection line group SSL00 to SSL05 is activated. The verify operations may be repeated with respect to remaining string selection line groups.

Further, referring to program loops PL6 and PL7 in which the second and third states are programmed simultaneously, verify operations of the second and third states may be made continuously with one string selection line being activated continuously. For example, a verify operation using a verify voltage Vvfy2 of the second state and a verify operation using a verify voltage Vvfy1 of the third state are carried out continuously when a string selection line group SSL00 to SSL05 is activated. The verify operations may be repeated with respect to remaining string selection line groups.

Figure 17:
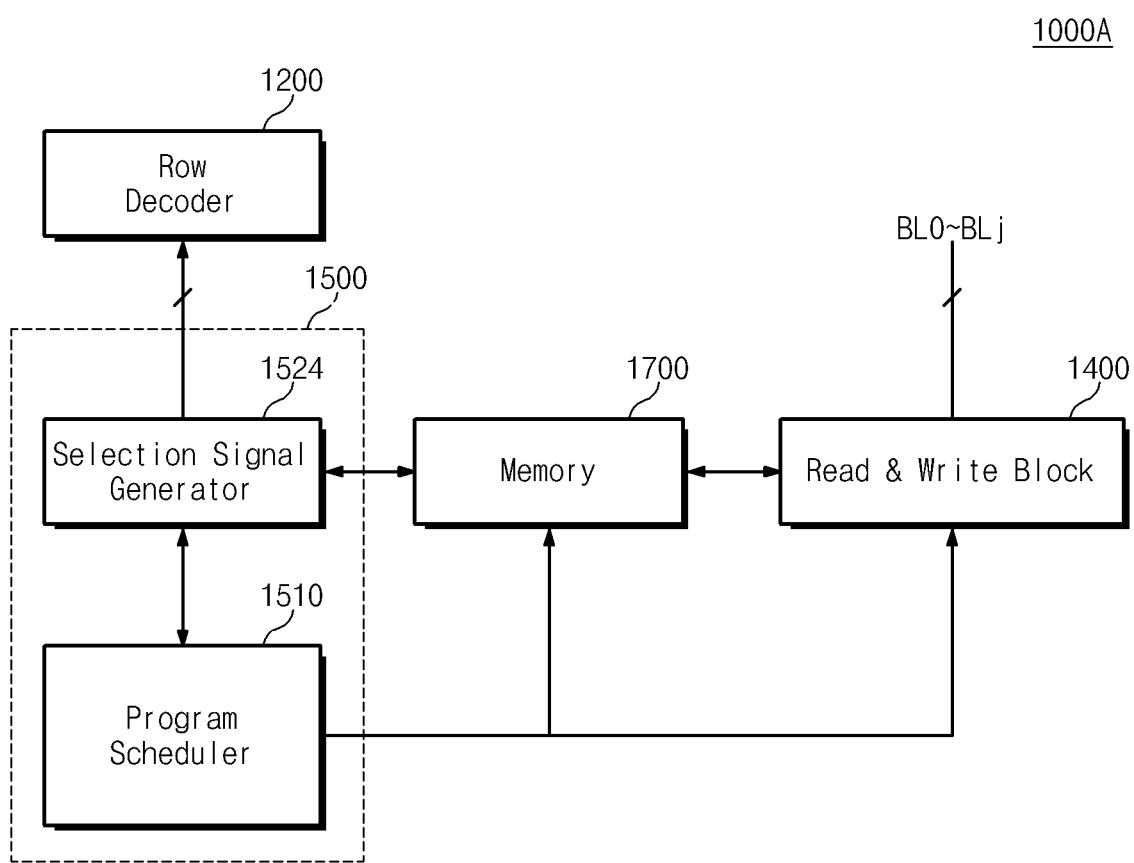
FIG. 17 is a block diagram showing a non-volatile memory device according to another exemplary embodiment of the inventive concept.

FIG. 17 is a block diagram showing a non-volatile memory device according to another exemplary embodiment of the present general inventive concept.

A non-volatile memory device 1000A illustrated in FIG. 17 is substantially identical to that described in FIGS. 1 and 3 except that a memory 1700 described in FIG. 3 is provided outside control logic 1500.

Figure 18:
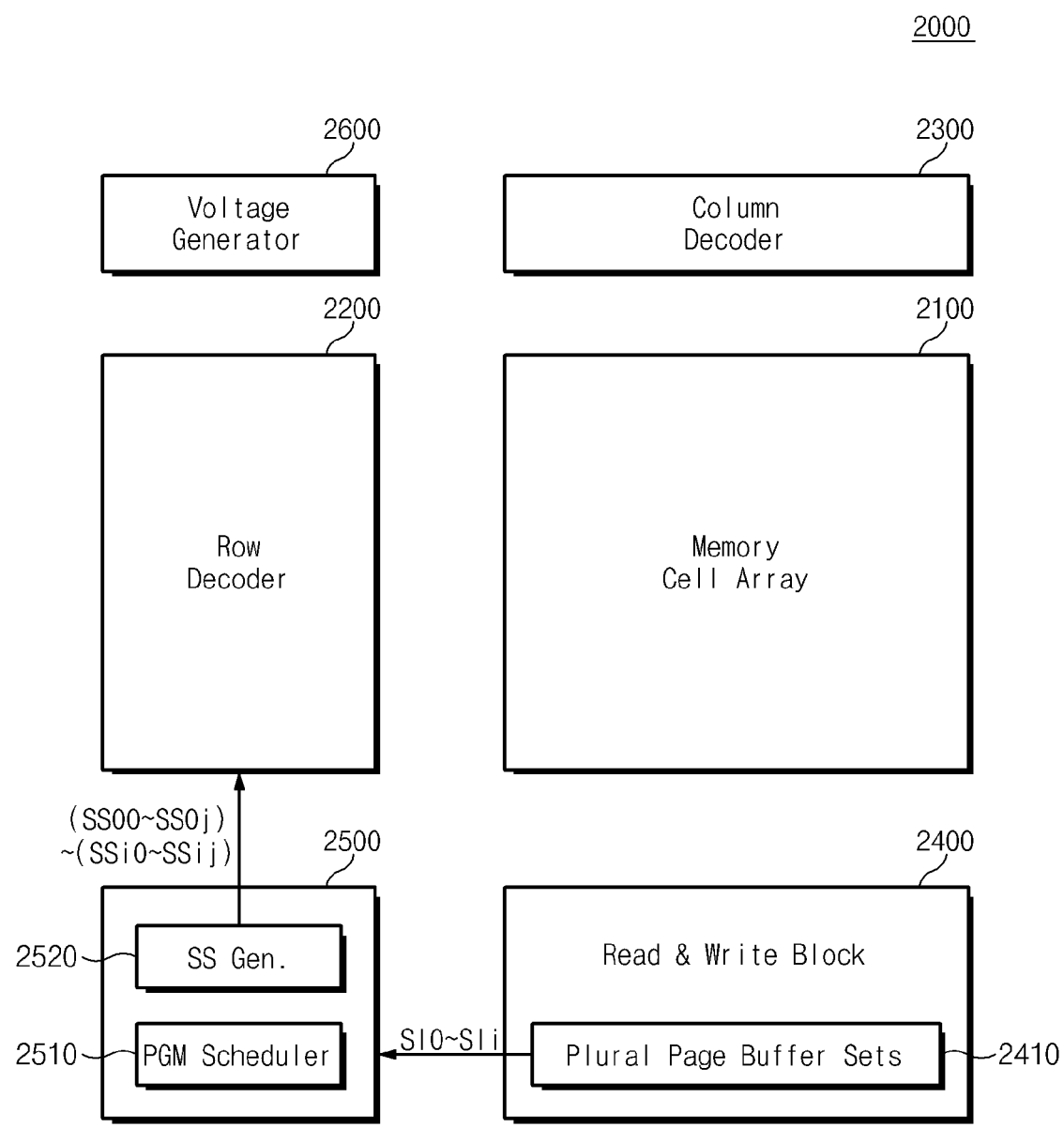
FIG. 18 is a block diagram showing a non-volatile memory device according to still another exemplary embodiment of the inventive concept.

FIG. 18 is a block diagram showing a non-volatile memory device according to still another exemplary embodiment of the present general inventive concept.

Referring to FIG. 18, a non-volatile memory device 2000 according to still another exemplary embodiment of the general inventive concept includes a memory cell array 2100, a row decoder circuit 2200, a column decoder circuit 2300, a read and write block 2400, control logic 2500, and a voltage generator circuit 2600. The elements 2100, 2200, 2300, and 2600 illustrated in FIG. 18 are substantially identical to those illustrated in FIG. 1, and a description thereof is thus omitted.

The read and write block 2400 operates responsive to the control of the control logic 2500 and sequentially drives bit lines of the memory cell array 2100 with a bit line program voltage (for example, 0V) within a string selection line setup and bit line charging period of each program loop. The read and write block 2400 includes a plurality of page buffer sets 2410 which temporarily store data to be programmed simultaneously at memory cells of commonly connected word lines of each word line layer. The plurality of page buffer sets 2410 may provide the control logic 2500 with state information SI0 to SIi at a string selection line setup and bit line charging period of each program loop, which will be more fully described hereinafter. Herein, the state information SI0 to SIi may indicate states to be stored in memory cells based upon data values to be programmed.

The control logic 2500 may be configured to control an overall operation of the non-volatile memory device 2000. The control logic 2500 may include a program scheduler 2510 and a selection signal generator 2520. The program scheduler 2510 is configured to control a program operation and the selection signal generator 2520 generates a plurality of string selection signals (SS00~SS0j) to (SSi0~SSij) in response to state information SI0 to SIi provided from the plurality of page buffer sets 2410. The plurality of string selection signals (SS00~SS0j) to (SSi0~SSij) may be sent to string selection lines (for example, corresponding to each of commonly connected word lines) via the row decoder circuit 2200.

Figure 19:
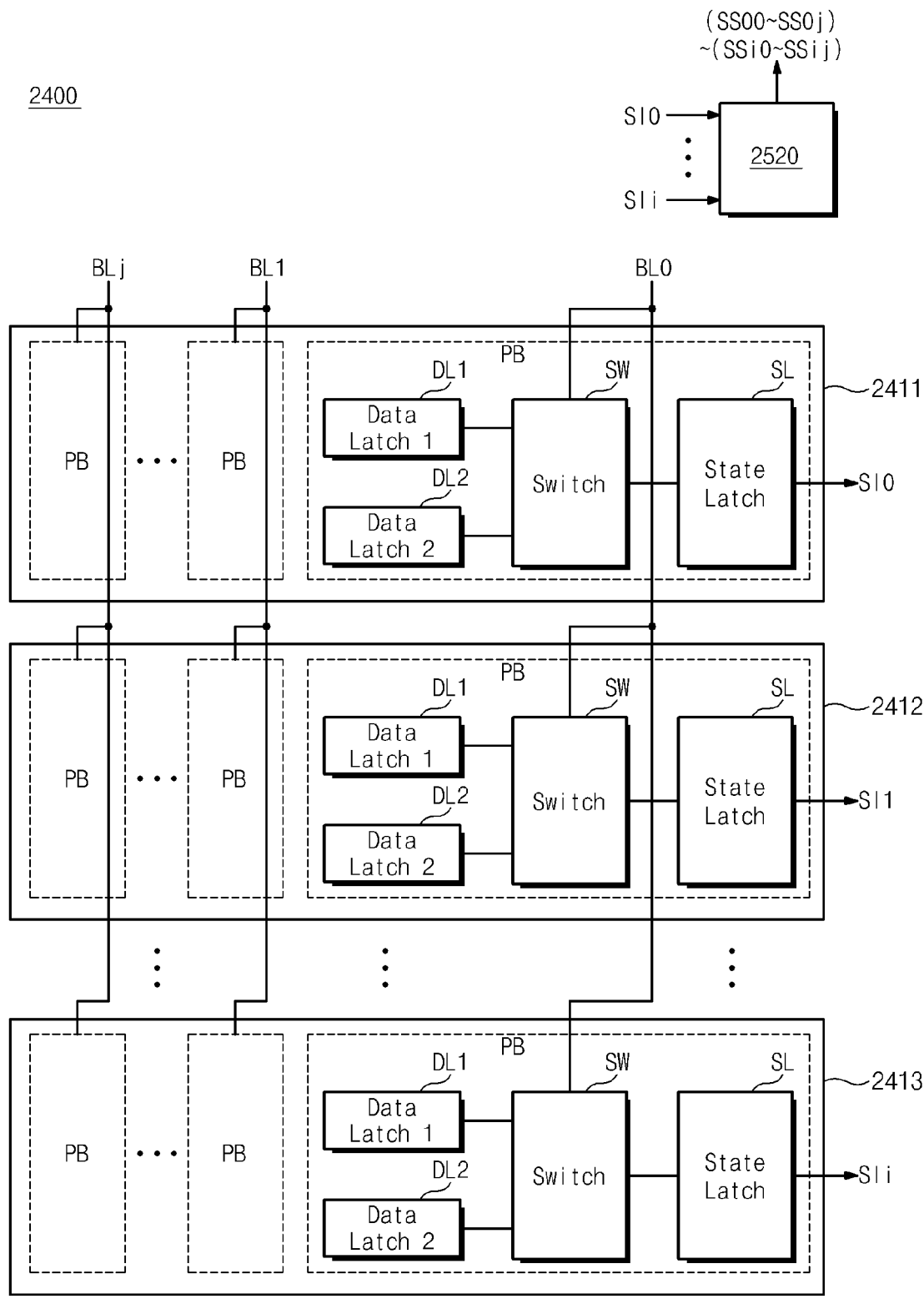
FIG. 19 is a block diagram showing a read and write block illustrated in FIG. 18.

FIG. 19 is a block diagram showing a read and write block illustrated in FIG. 18.

Referring to FIG. 19, a read and write block 2400 may include a plurality of page buffer sets 2411 to 2413, each of which includes a plurality of page buffers PB each corresponding to bit lines BL0 to BLj. The page buffer sets 2411 to 2413 may correspond to commonly connected word lines of each word line layer, respectively. That is, the page buffer sets 2411 to 2413 may store data to be stored simultaneously at memory cells of commonly connected word lines of each word line layer. For example, as described in FIG. 2, the read and write block 2400 may include at least four page buffer sets when four word lines are electrically connected one another. Data stored in the page buffer sets 2411 to 2413 may constitute data shown in FIG. 8. Each of page buffers PB in the page buffer set 2410 may include at least two data latches DL1 and DL2 for storing data to be programmed, a switch circuit SW for logically combining data bits stored in the data latches DL1 and DL2 in response to the control of control logic 2500, and a state latch SL for latching state information SI combined by the switch circuit SW.

The non-volatile memory device illustrated in FIG. 18 may be configured to simultaneously program memory cells of commonly connected word lines of each word line layer. A program operation of the non-volatile memory device illustrated in FIG. 18 may be made substantially the same as described in FIG. 9 except for the following difference. In case of a program method described in FIG. 9, activation of a plurality of string selection signals may be made according to data stored in a memory 1522. On the other hand, in case of the non-volatile memory device illustrated in FIG. 18, activation of a plurality of string selection signals (SS00~SS0j) to (SSi0~SSij) may be made according to state information provided from the plural page buffer sets 2411 to 2413.

For example, at a program operation of a '01' state, a state of data values stored in data latches DL1 and DL2 may be reflected on a bit line BL0 via a switch circuit SW controlled by control logic 2500. For example, it is assumed that memory cells of commonly connected word lines are programmed to a '01' state. If a state of data values in data latches DL1 and DL2 is a '01' state, a bit line BL0 may be set to a ground voltage via the switch circuit SW. At this time, a low-level signal may be latched by the state latch SL. In the event that a low-level signal is latched by the state latch SL, the state latch SL may issue state information SI of a low level. The state information SI of a low level indicates that data stored in a page buffer PB connected to a bit line BL0 is data to be programmed. That is, if a state of data values in data latches DL1 and DL2 is a '01' state at a program operation of a '01' state, a low-level state signal SI is provided to a selection signal generator 2520 of the control logic 2500. On the other hand, if a state of data values in data latches DL1 and DL2 is a '00', '10', or '11' state at a program operation of a '01' state, a high-level state signal SI is provided to the selection signal generator 2520 of the control logic 2500. State information may be produced by page buffers PB in each column according to the same manner as described above.

At a program operation of a '01' state, page buffers PB connected with one bit line (for example, BL0) generates state signals SI0 to SIi, and the selection signal generator 2520 simultaneously activates all or a part of a plurality of groups of string selection signals in response to the state signals SI0 to SIi. For example, the selection signal generator 2520 simultaneously activates string selection signals in any column corresponding to state signals having a low level among the state signals SI0 to SIi. Once activation of string selection lines is determined according to the above-described manner, each bit line may be driven by a ground voltage according to the above-described manner. As a result, memory cells of commonly connected word lines may be programmed at the same time. The non-volatile memory device illustrated in FIG. 18 may perform a verify operation using any one of verify manners described in FIGS. 10, 15, and 16.

Like a program operation of a '01' state, program operations of remaining states may be made in the same manner as above described, using activation of string selection lines, sequential driving of bit lines, and page buffer sets, and a further description thereof is thus omitted.

Figure 20:
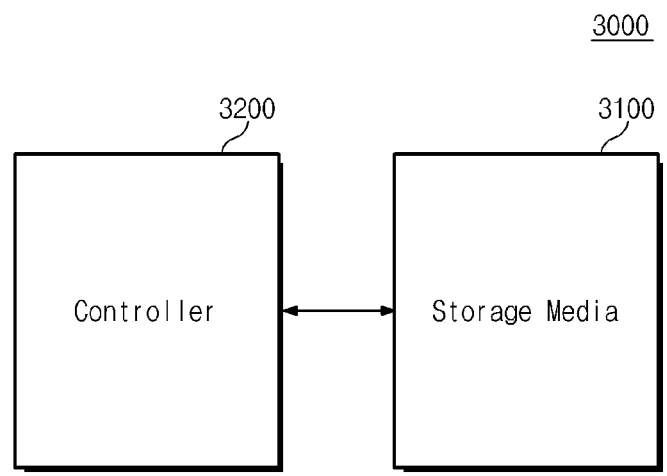
FIG. 20 is a block diagram showing a data storage device including a non-volatile memory device according to an exemplary embodiment of the inventive concept.

FIG. 20 is a block diagram showing a data storage device including a non-volatile memory device according to an exemplary embodiment of the present general inventive concept.

Referring to FIG. 20, a data storage device 3000 may include a storage media 3100 and a controller 3200. The storage media 3100 may be used to store data information having various data formats such as text, graphic, software code, and the like. The storage media 3100 is formed of a non-volatile memory device described in FIG. 1, 17, or 18, and the non-volatile memory device is configured to program memory cells of commonly connected word lines of each word line layer at the same time. This is carried out substantially the same as described above, and description thereof is thus omitted. The controller 3200 may be configured to control the storage media 3100 in response to external requests.

Figure 21:
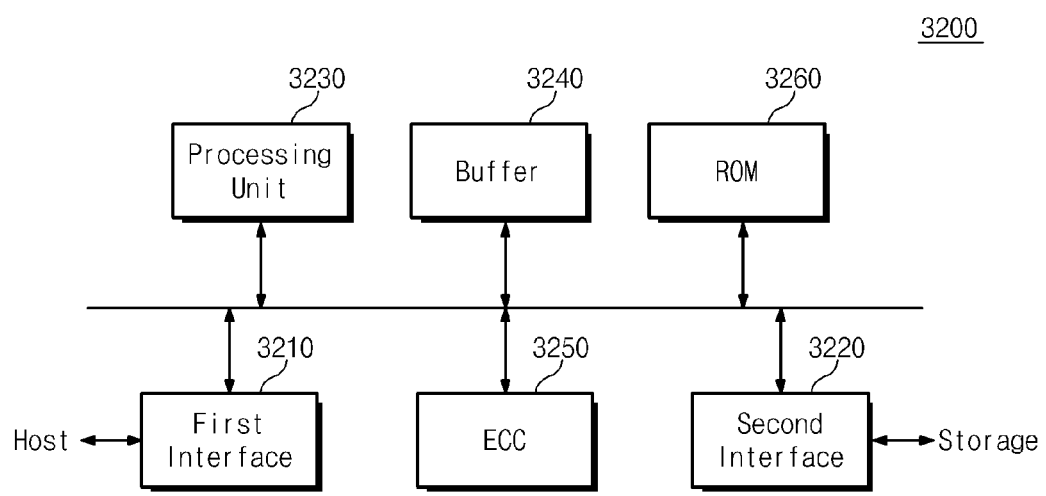
FIG. 21 is a block diagram showing a controller illustrated in FIG. 20 according to an exemplary embodiment of the inventive concept.

FIG. 21 is a block diagram showing a controller illustrated in FIG. 20 according to an exemplary embodiment of the general inventive concept. Referring to FIG. 21, a controller 3200 according to an exemplary embodiment of the inventive concept may include the first interface 3210, the second interface 3220, a processing unit 3230, a buffer 3240, an ECC unit 3250, and a ROM 3260.

The first interface 3210 may be configured to interface with an external source (or, a host). The second interface 3220 may be configured to interface with a storage media 3100 shown in FIG. 20. The processing unit 3230 may be configured to control an overall operation of the controller 3200. For example, the processing unit 3230 may be configured to operate firmware such as a Flash Translation Layer (FTL) stored in the ROM 3260. The buffer 3240 may be used to temporarily store data transferred from an external source via the first interface 3210. The buffer 3240 may be used to temporarily store data transferred from the storage media 3100 via the second interface 3220. The ECC unit 3250 may be configured to encode data to be stored in the storage media 3100 and to decode data read from the storage media 3100.

Figure 22:
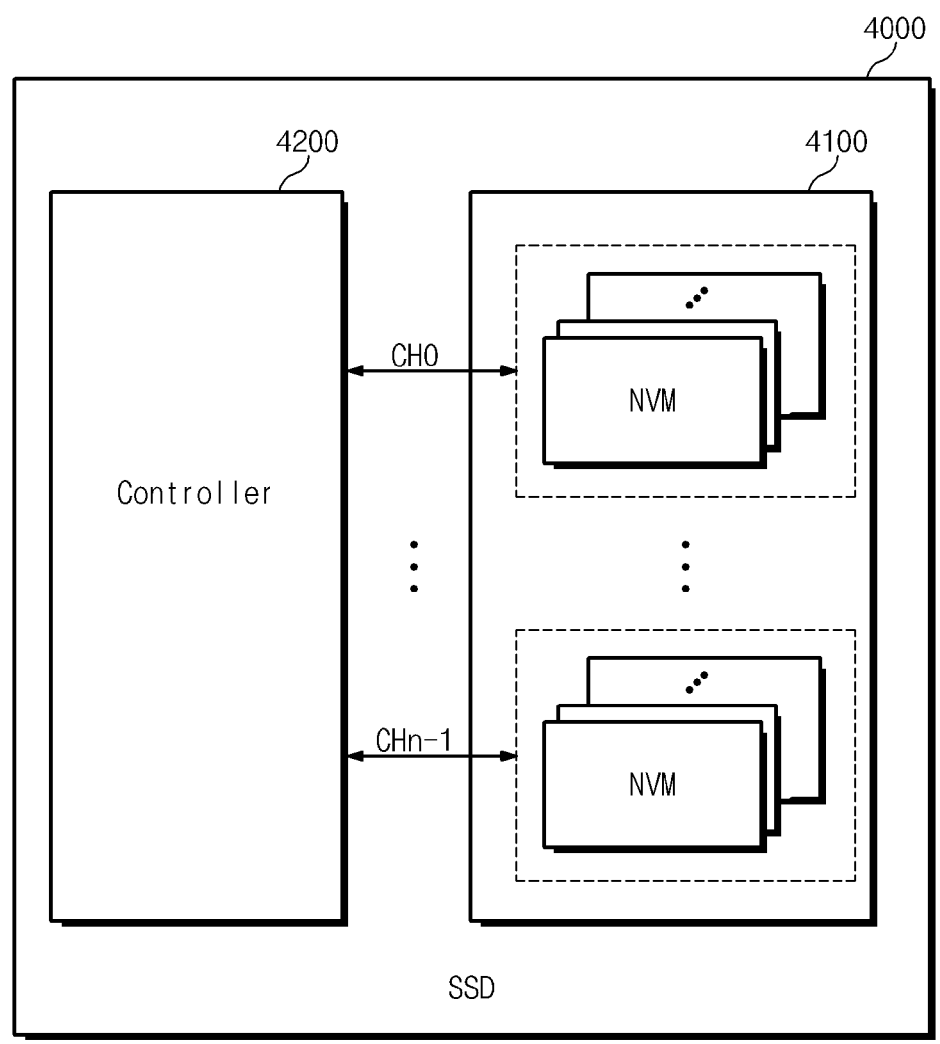
FIG. 22 is a block diagram showing a solid state drive using a non-volatile memory device according to an exemplary embodiment of the inventive concept.

FIG. 22 is a block diagram showing a solid state drive using a non-volatile memory device according to an exemplary embodiment of the general inventive concept.

Referring to FIG. 22, a Solid State Drive (SSD) 4000 may include a storage media 4100 and a controller 4200. The storage media 3100 may be connected to the controller 4200 via a plurality of channels CH0 to CHn−1. A plurality of non-volatile memories may be connected in common to each channel. As described in FIG. 1, 17, or 18, each non-volatile memory may be configured to simultaneously program memory cells of commonly connected word lines of each word line layer. The controller 4200 may be configured to control the storage media 4100.

Figure 23:
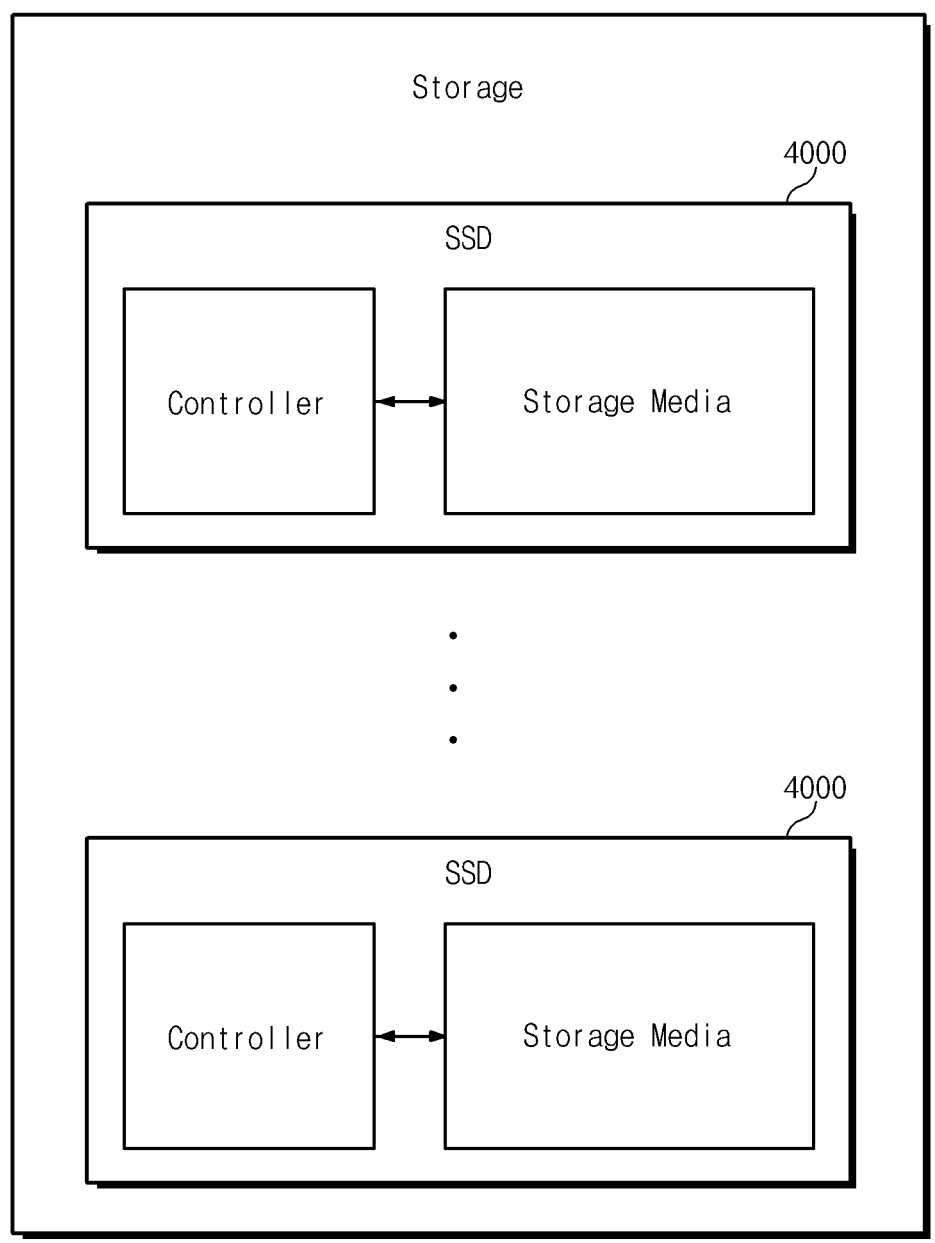
FIG. 23 is a block diagram showing storage using a solid state drive illustrated in FIG. 22.
Figure 24:
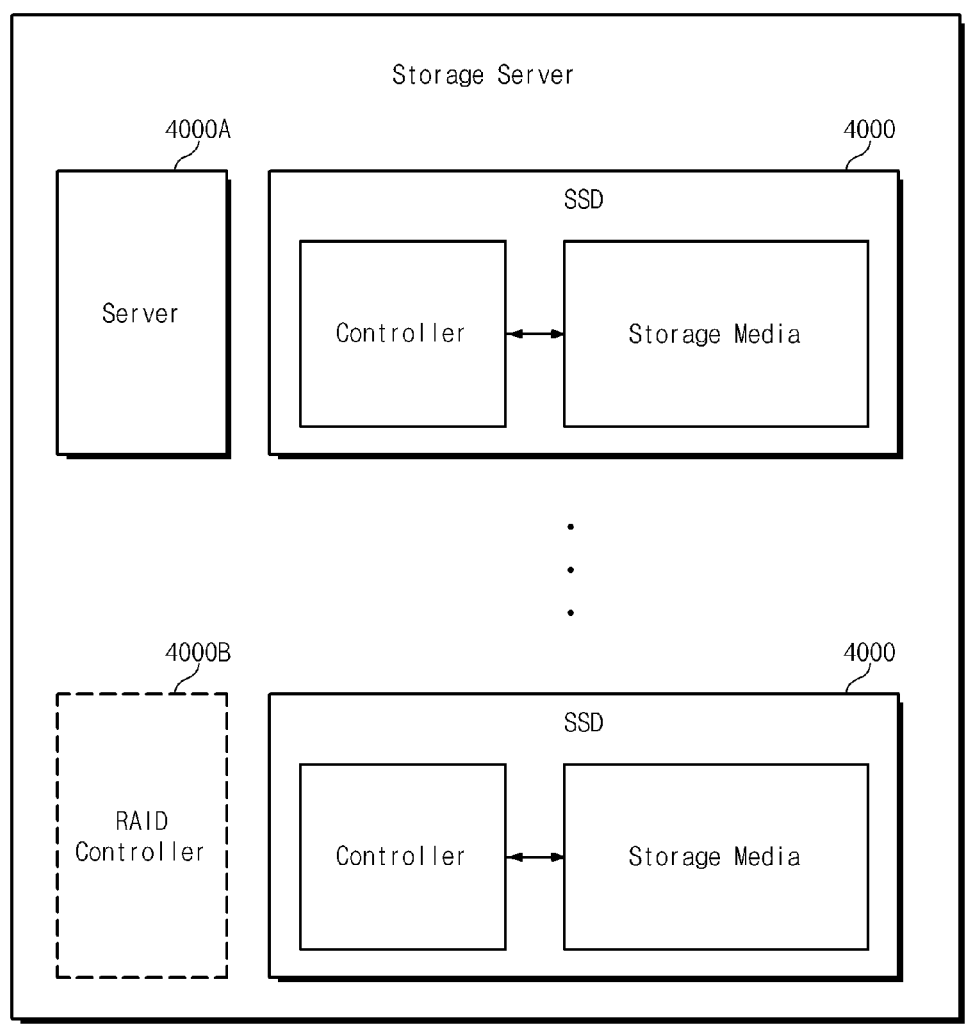
FIG. 24 is a block diagram showing a storage server using a solid state drive illustrated in FIG. 22.

FIG. 23 is a block diagram showing storage using a solid state drive illustrated in FIG. 22, and FIG. 24 is a block diagram showing a storage server using a solid state drive illustrated in FIG. 22.

A solid state drive 4000 according to an exemplary embodiment of the general inventive concept may be used to implement storage devices. As illustrated in FIG. 23, the storage may include a plurality of solid state drives 4000, each of which is configured the same as described in FIG. 22. A solid state drive 4000 according to an exemplary embodiment of the general inventive concept may be used to implement storage servers. As illustrated in FIG. 24, the storage server may include a plurality of solid state drives 4000, each of which is configured the same as described in FIG. 22, and a server 4000A. Further, it is well understood that the well-known RAID controller 4000B is provided with the storage server.

Figure 25:
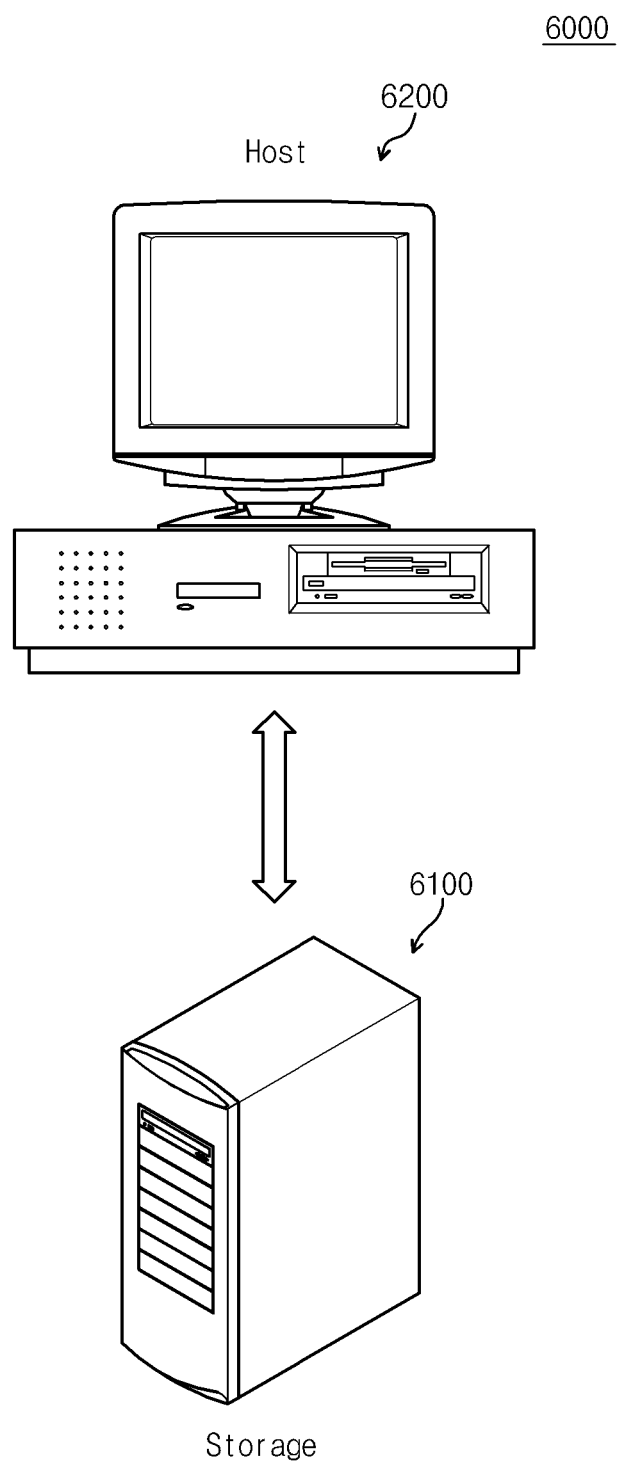
FIGS. 25 to 27 are diagrams showing systems to which a data storage device according to an exemplary embodiment of the inventive concept is applied.
Figure 26:
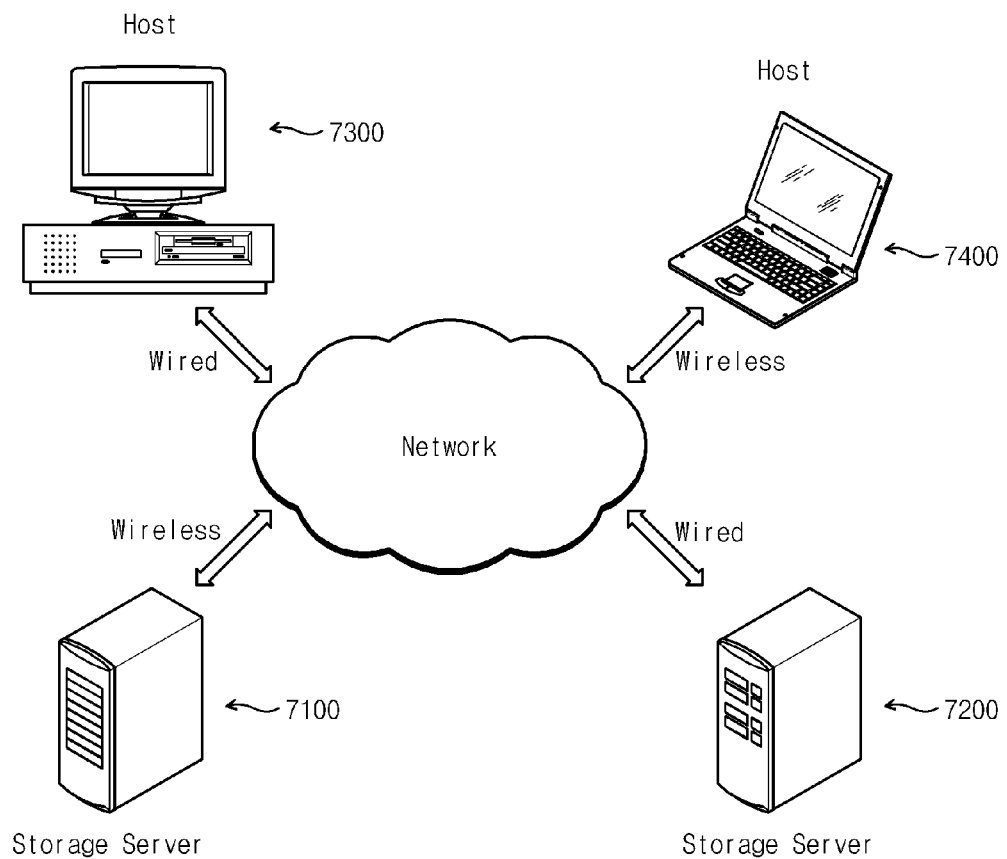
Figure 27:
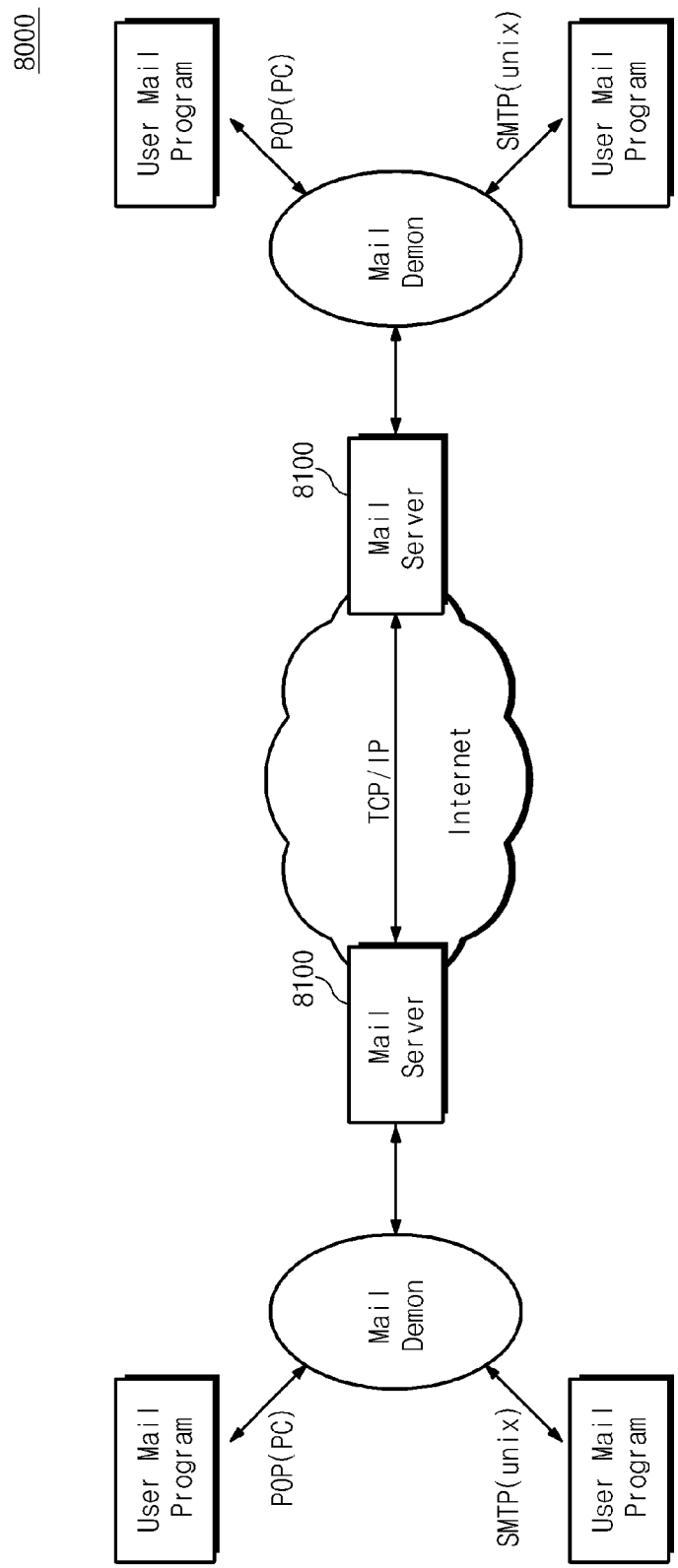

FIGS. 25 to 27 are diagrams showing systems to which a data storage device according to an exemplary embodiment of the general inventive concept is applied.

In the event that a solid state drive including a data storage device according to embodiments of the inventive concept is applied to storages, as illustrated in FIG. 25, a system 6000 may include the storage 6100 communicating with a host 6200 in a wire or wireless manner. In the event that a solid state drive including a data storage device according to embodiments of the inventive concept is applied to a storage server, as illustrated in FIG. 26, a system 7000 may include the storage servers 7100 and 7200 communicating with a host 7300 and 7400 in a wire or wireless manner. Further, as illustrated in FIG. 27, it is possible to apply a solid state drive in a system 8000 including a data storage device according to embodiments of the inventive concept, to a mail server 8100.

FIGS. 28 to 32 are diagrams showing other systems to which a non-volatile memory device according to an exemplary embodiment of the general inventive concept is applied.

Figure 28:
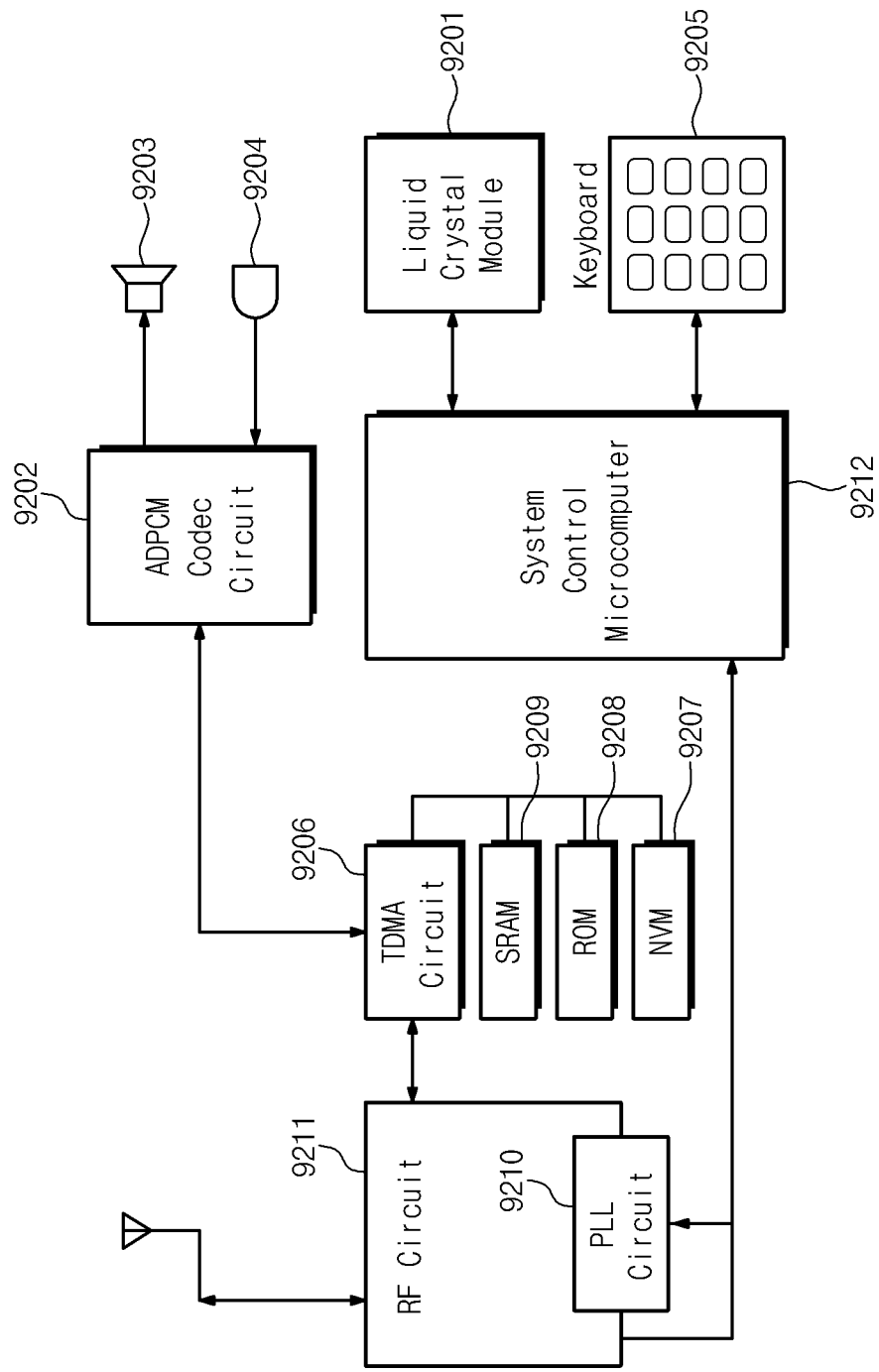
FIGS. 28 to 32 are diagrams showing other systems to which a non-volatile memory device according to an exemplary embodiment of the inventive concept is applied.

FIG. 28 is a block diagram illustrating a cellular phone system to which a non-volatile memory device according to embodiments of the inventive concept is applied. Referring to FIG. 28, a cellular phone system may include an ADPCM codec circuit 9202 for compressing a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, an LCD module 9201, a keyboard 9205, and the like.

Further, the cellular phone system may include various types of memories, such as the non-volatile memory device 9207, the ROM 9208, and the SRAM 9209. The non-volatile memory device 9207 may be formed of a non-volatile memory device according to embodiments of the inventive concept. The ROM 9208 may be used to store programs, and the SRAM 9209 may be used as a work region for the system control microcomputer 9212 or/and to temporarily store data. Herein, the system control microcomputer 9212 is a processor which is configured to control write and read operations of the non-volatile memory device 9207.

Figure 29:
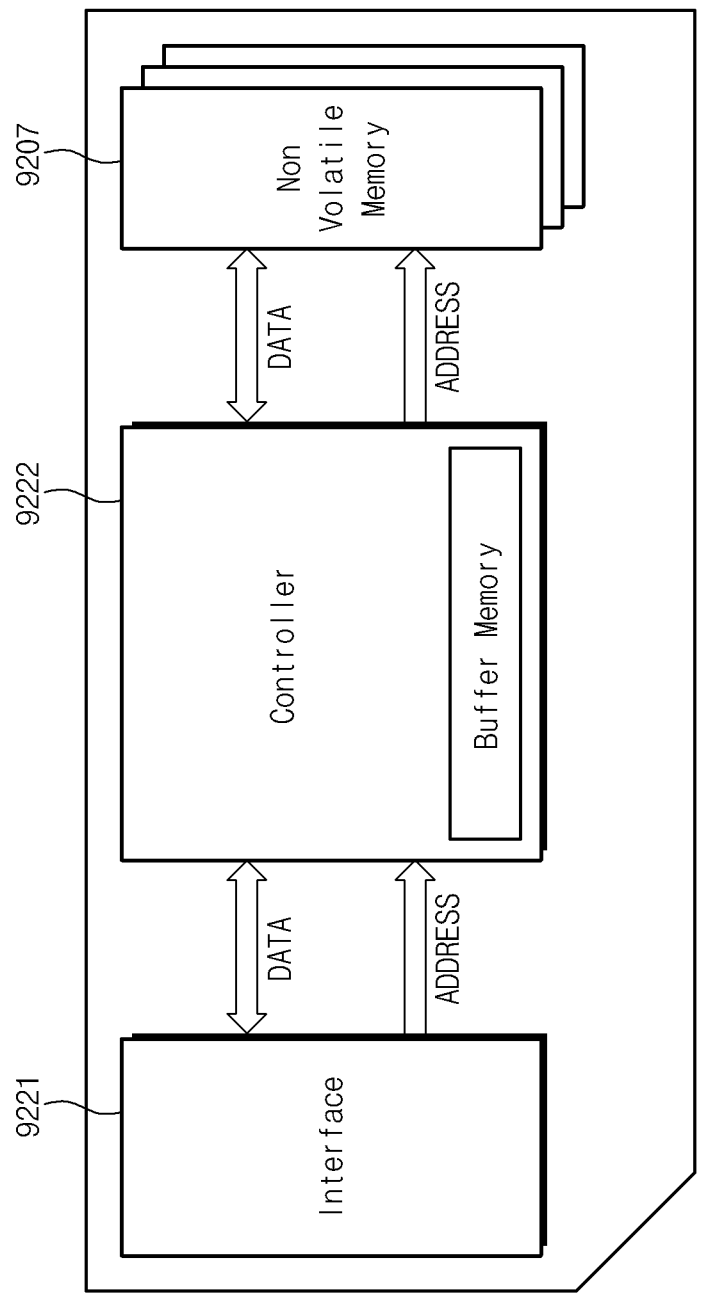

FIG. 29 is a block diagram illustrating a memory card to which a non-volatile memory device according to embodiments of the general inventive concept is applied. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 29, the memory card may include an interface circuit 9221 for interfacing with an external device, a controller 9222 including a buffer memory and controlling an operation of the memory card, and at least one non-volatile memory device 9207 according to embodiments of the inventive concept. The controller 9222 may be a processor which is configured to control write and read operations of the non-volatile memory device 9207. In particular, the controller 9222 may be coupled with the non-volatile memory device 9207 and the interface circuit 9221 via a data bus and an address bus.

Figure 30:
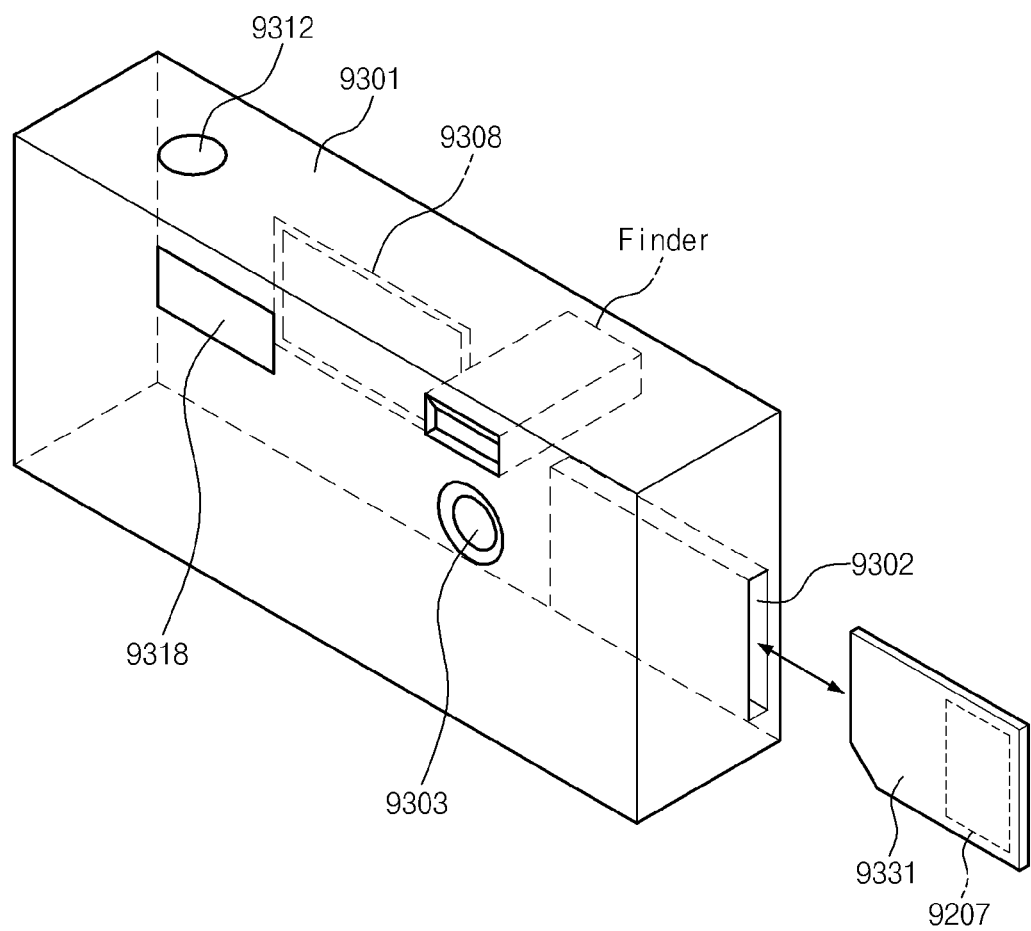

FIG. 30 is a block diagram illustrating a digital still camera to which a non-volatile memory device according to embodiments of the inventive concept is applied. Referring to FIG. 30, a digital still camera may include a body 9301, a slot 9302, a lens 9303, a display circuit 9308, a shutter button 9312, a strobe 9318, and the like. In particular, a memory card 9331 may be inserted in the slot 9308 and include at least one non-volatile memory device 9207 according to embodiments of the inventive concept.

If the memory card 9331 has a contact type, an electric circuit on a circuit board may be electrically contacted with the memory card 9331 when it is inserted in the slot 9308. In the event that the memory card 9331 has a non-contact type, an electric circuit on a circuit board may communicate with the memory card 9331 in a radio-frequency manner.

Figure 31:
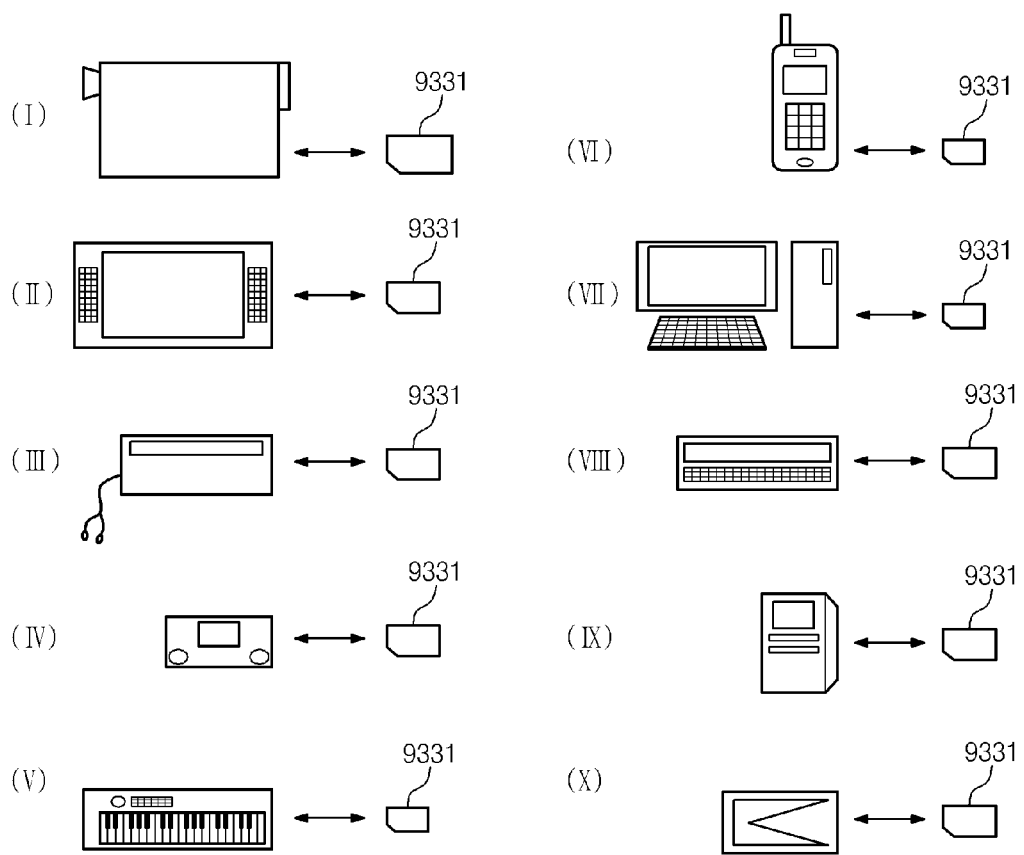

FIG. 31 is a diagram illustrating various systems to which a memory card in FIG. 30 is applied.

Referring to FIG. 31, a memory card 9331 may be applied to (1) a video camera, (2) a television, (3) an audio device, (4) a game machine, (5) an electronic music device, (6) a cellular phone, (7) a computer, (8) a Personal Digital Assistant (PDA), (9) a voice recorder, (10) a PC card, and the like.

Figure 32:
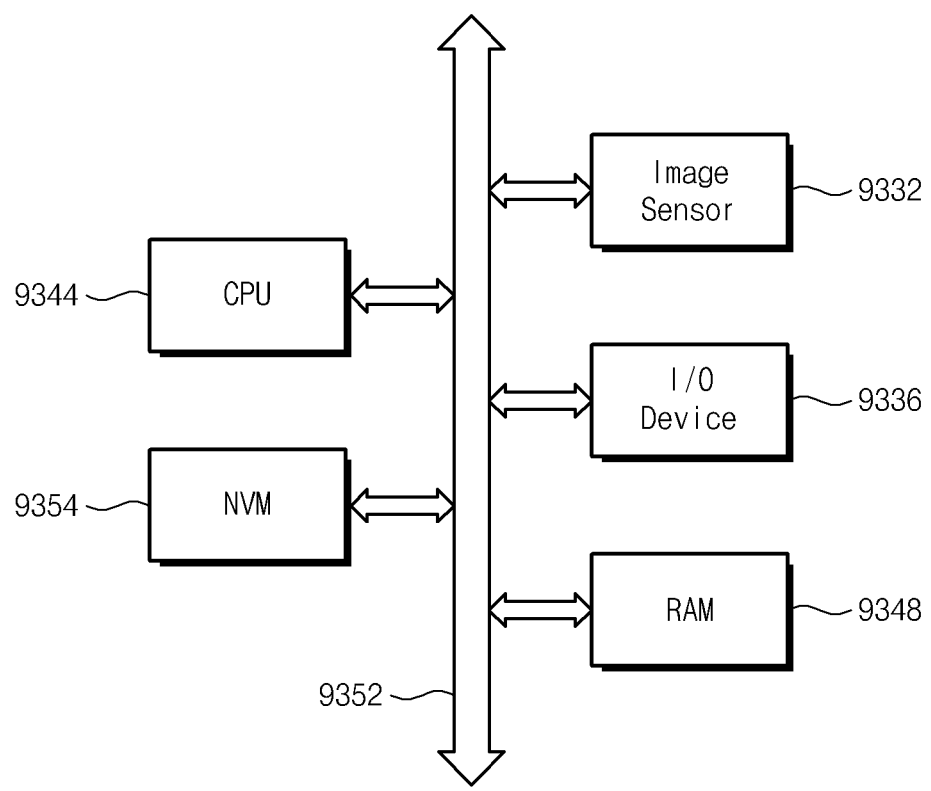

FIG. 32 is a block diagram illustrating an image sensor system to which a non-volatile memory device according to embodiments of the general inventive concept is applied.

Referring to FIG. 32, an image sensor system may include an image sensor 9332, an input/output device 9336, RAM 9348, CPU 9344, and a non-volatile memory device 9354 according to embodiments of the inventive concept. Elements in FIG. 32 may communicate with one another via a bus 9352. The image sensor 9332 may include a photo sensing device such as a photo-gate, photo-diode, or the like. Elements in FIG. 32 may be formed of a single chip together with a processor or independently from the processor.

FIGS. 33 to 43 are perspective views for describing a fabrication method of a non-volatile memory device according to an exemplary embodiment of the general inventive concept.

Figure 33:
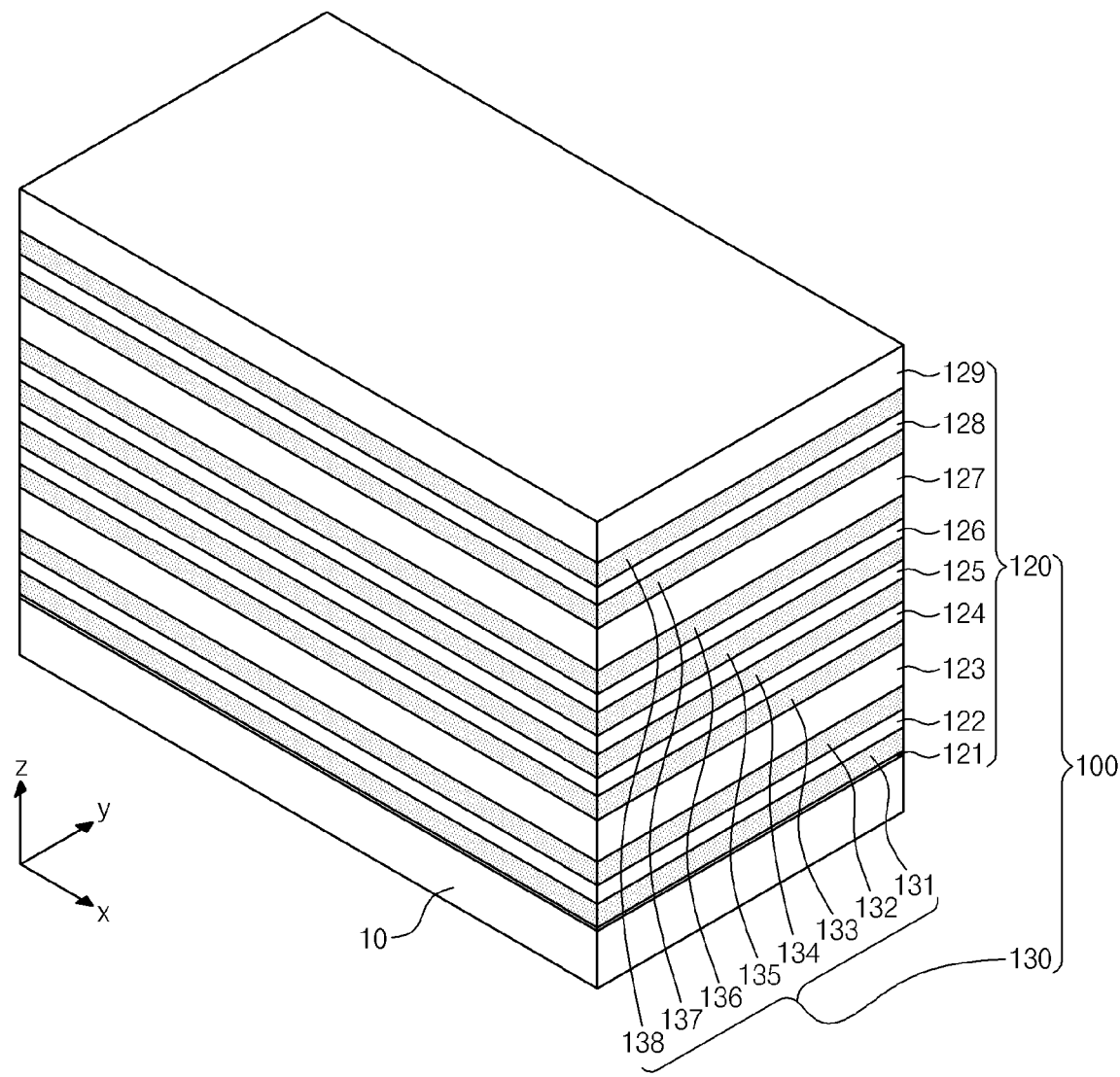
FIGS. 33 to 43 are perspective views for describing a fabrication method of a non-volatile memory device according to an exemplary embodiment of the inventive concept.

Referring to FIG. 33, a structure 100 is formed on a substrate 10. The substrate 10 may be one of semiconductor materials, insulation materials, and a semiconductor or conductor covered by insulation material. For example, the substrate 10 may be a silicon wafer. The structure 100 includes a plurality of insulation films 121 to 129 and a plurality of sacrificial films 131 to 138. The insulation films 120 and the sacrificial films 130 may be stacked in turn and iteratively as illustrated in FIG. 33. The sacrificial film 130 may be formed of a material which is able to be selectively etched with respect to the insulation film 120. That is, at a process of etching the sacrificial film 130 using an etch recipe, the sacrificial film 130 may be formed of a material which is able to be etched with etching of the insulation film 120 being minimized.

Figure 34:
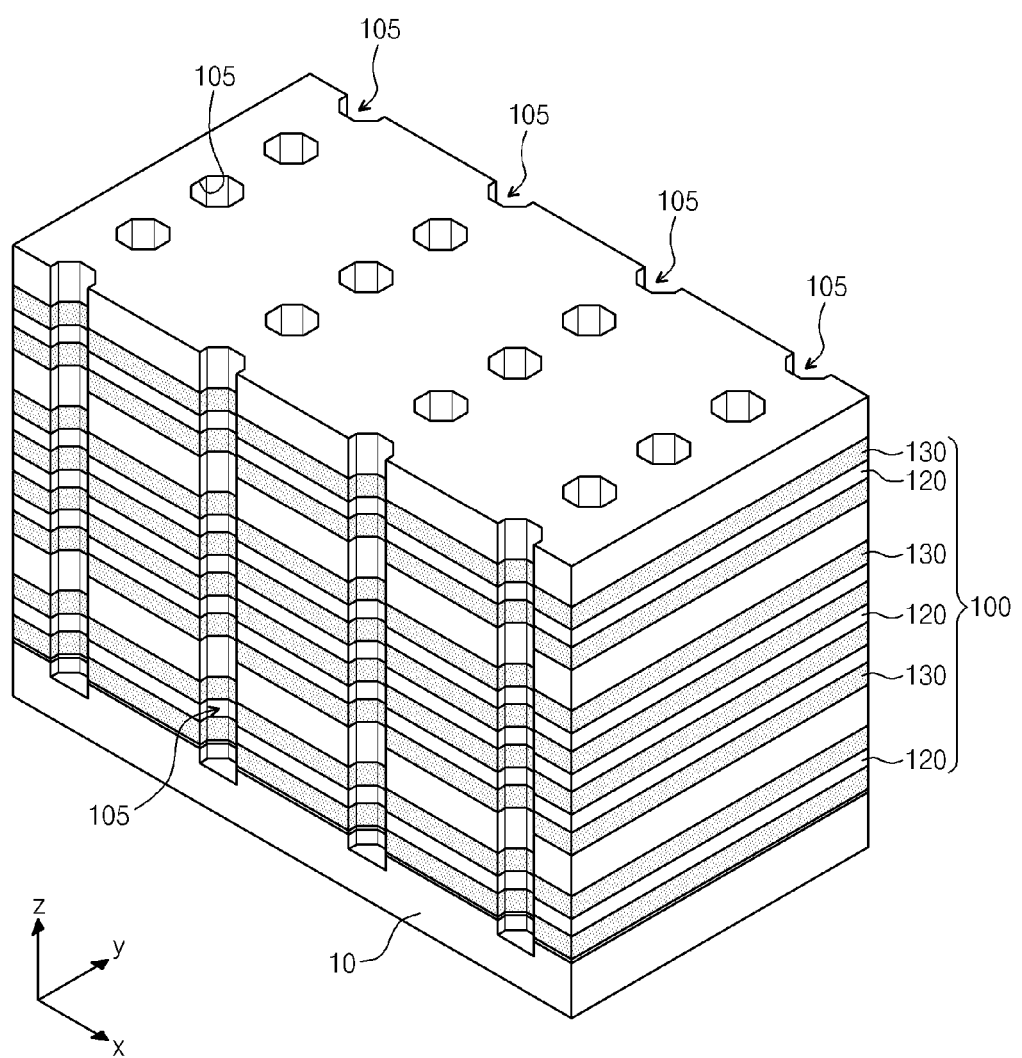
Figure 35:
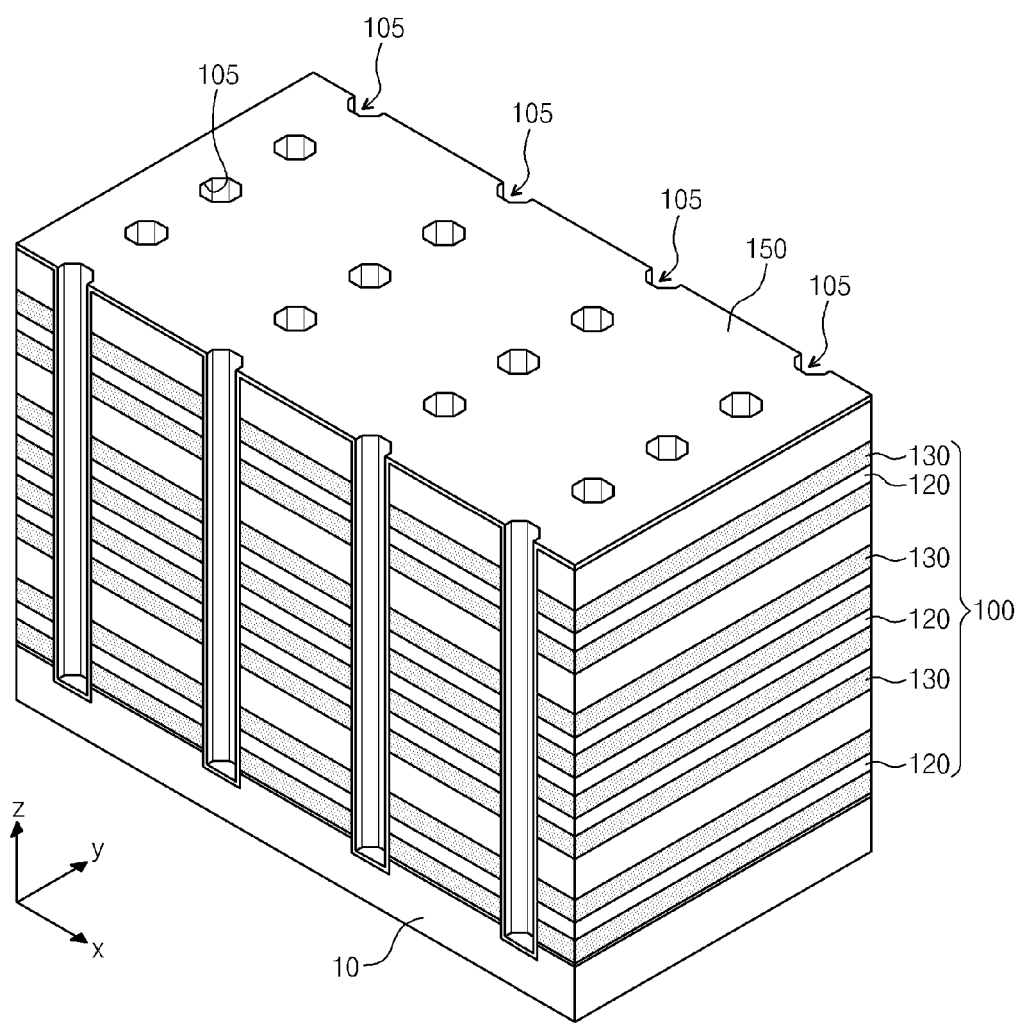

Referring to FIGS. 34 and 35, after forming openings 105 penetrating the structure 100, a vertical film 150 is formed to conformably cover inner walls of the openings 105. The vertical film 150 is able to be extended horizontally from the openings 105 to cover an upper surface of the structure 100. Forming of the openings 105 includes forming a mask pattern for defining locations of the openings 105 on the structure 100 and anisotropic-etching the structure 100 using the mask pattern as an etch mask. Since the structure 100 includes at least two types of different films, it is difficult to form sidewalls of the openings 105 so as to be perfectly vertical to an upper surface of the substrate 10.

In the event that the structure is directly formed on the substrate 10, the openings 105 may be formed to expose the upper surface of the substrate 10 as illustrated in FIG. 34. As an over-etch result of an anisotropic etch process, a substrate 10 under the openings 105 is able to be recessed to a predetermined depth as illustrated in FIG. 34. The vertical film 150 may be formed of one or more thin films. For example, the vertical film 150 may include at least one of thin films which are used as a memory element of a charge trap type non-volatile memory transistor.

Figure 36:
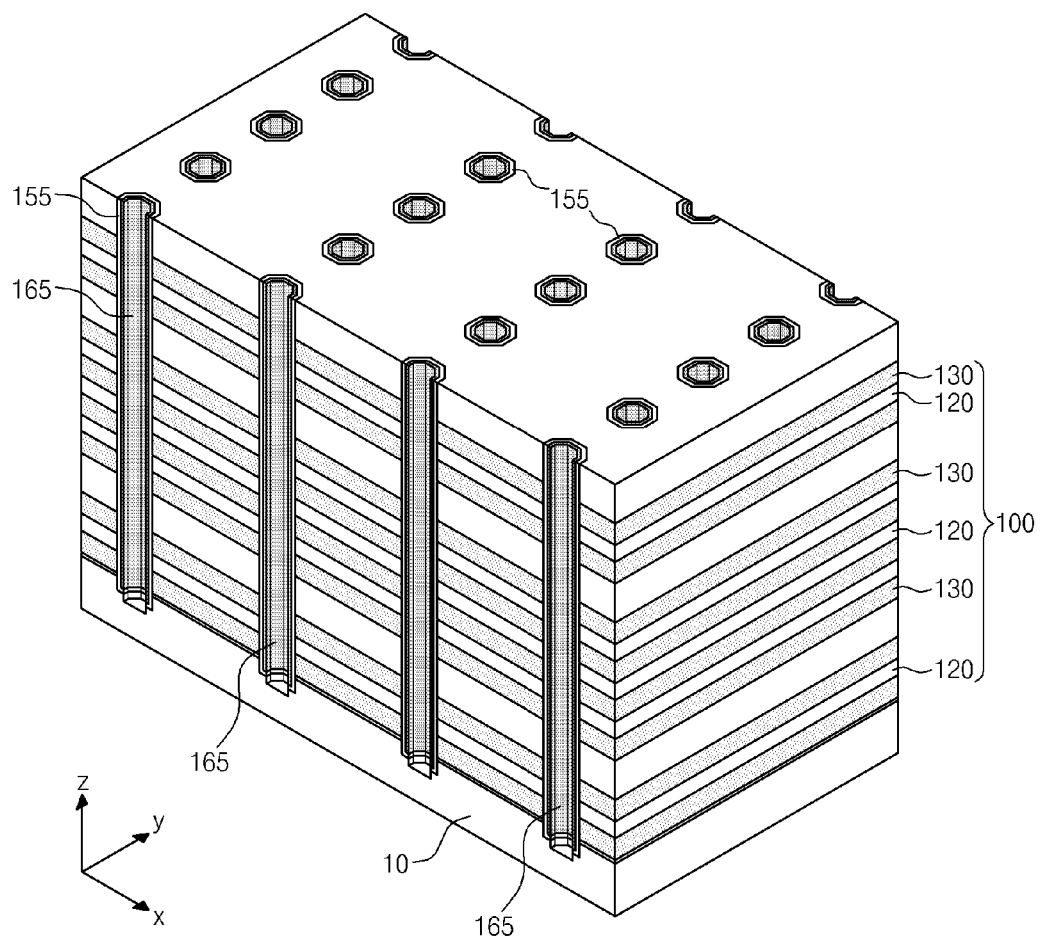

Referring to FIG. 36, a vertical pattern 155 and a semiconductor spacer 165 are formed to cover inner walls of the respective openings 105, respectively. This process may include forming the first semiconductor film covering a resultant structure in which the vertical film 150 is formed, and anisotropic-etching the first semiconductor film and the vertical film 150 so as to expose an upper surface of the semiconductor 10 at bottoms of the openings 105. This enables a vertical pattern 155 and a semiconductor spacer 165 to be formed with a cylinder shape of which both ends are opened. As an over-etch result of an anisotropic etch process of the first semiconductor film, an upper surface of a substrate 10 exposed by the semiconductor spacer 165 is able to be recessed as illustrated in figure.

Figure 37:
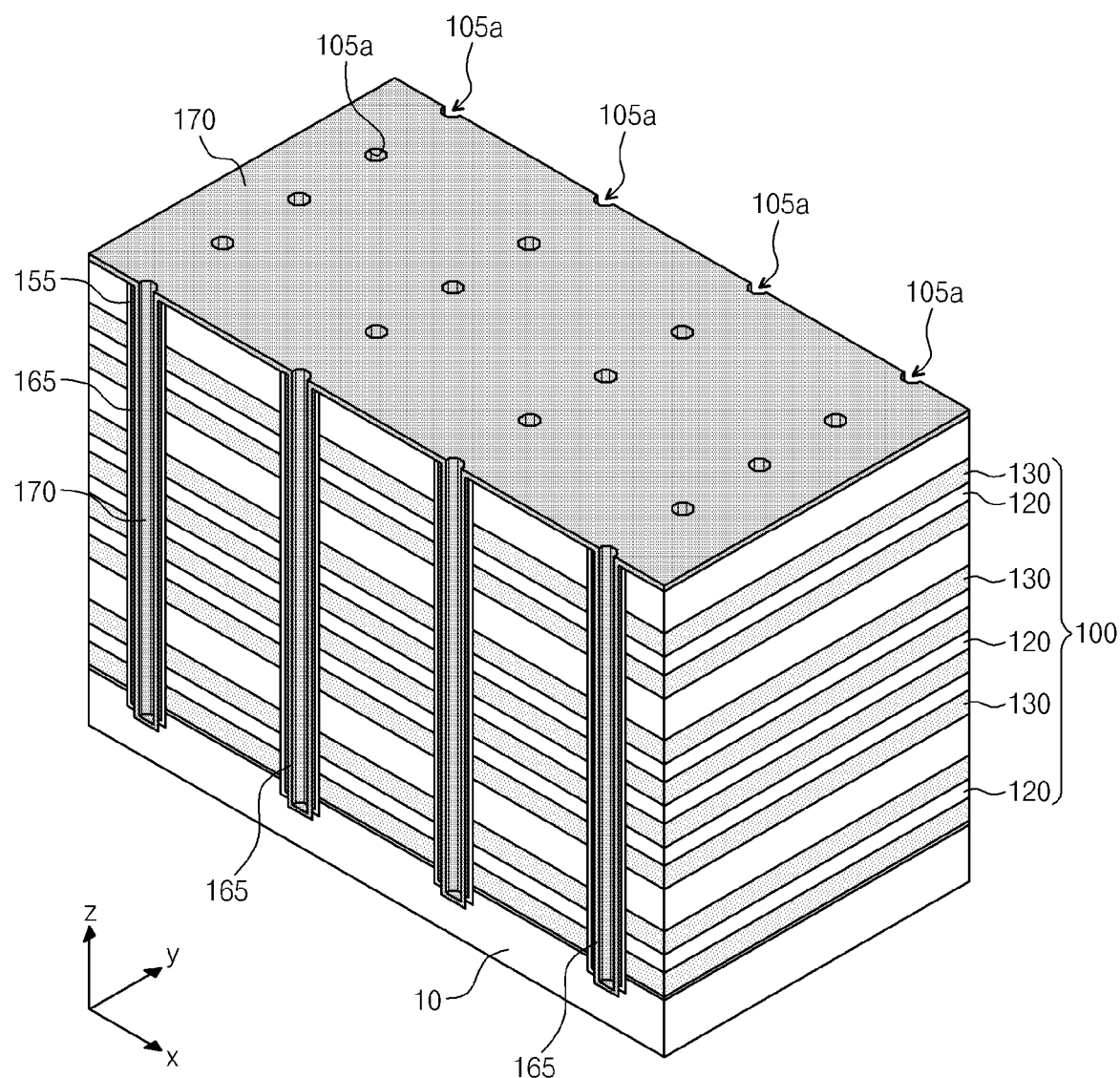
Figure 38:
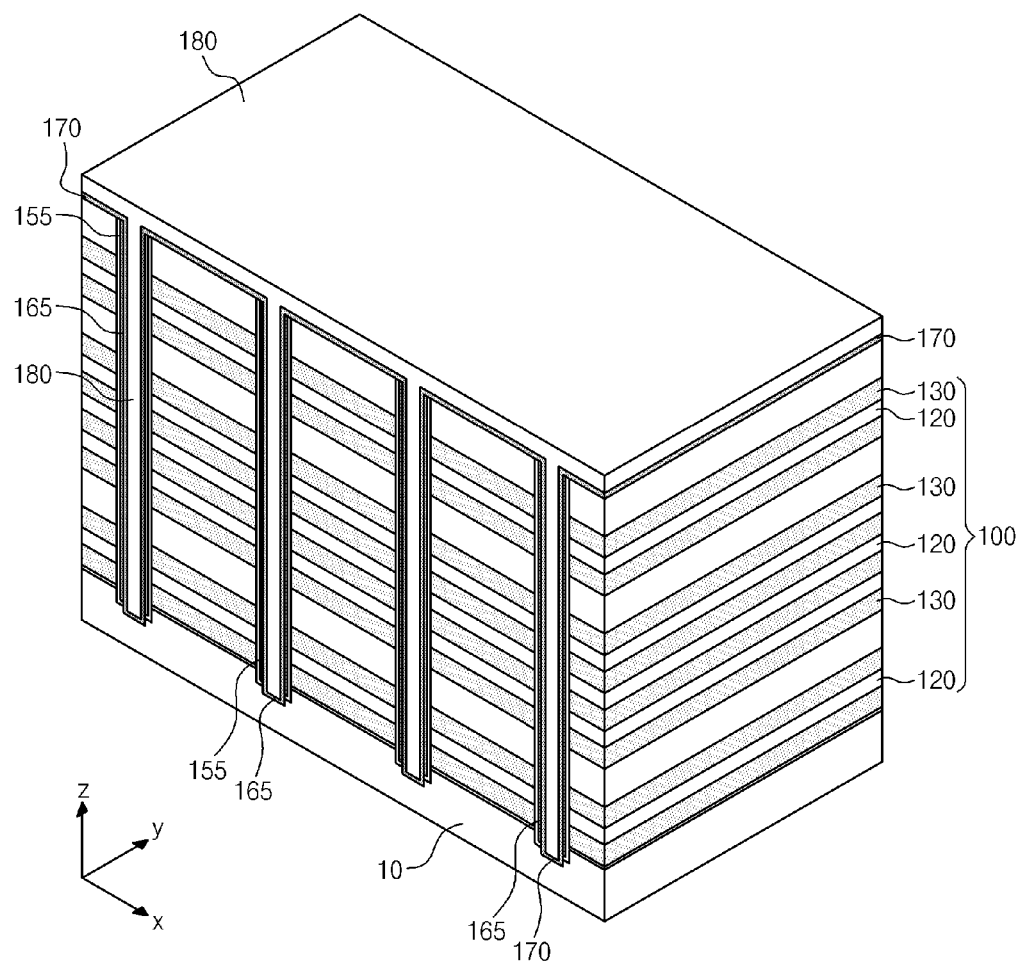

Referring to FIGS. 37 and 38, the second semiconductor film 170 and a buried insulation film 180 are formed sequentially on a result including the vertical pattern 155.

The second semiconductor film 170 may be a poly silicon film which is formed using one of ALD and CVD technologies. With an embodiment, the second semiconductor film 170 is conformably formed with a thickness by which the openings 105 are not buried perfectly. That is, as illustrated in figure, the second semiconductor film 170 is able to define pin holes 105a in the openings 105. The buried insulation film 180 is able to be formed to fill the pin holes 105a, and is one of a silicon oxide film and an insulation material formed using the SOG technology.

Figure 39:
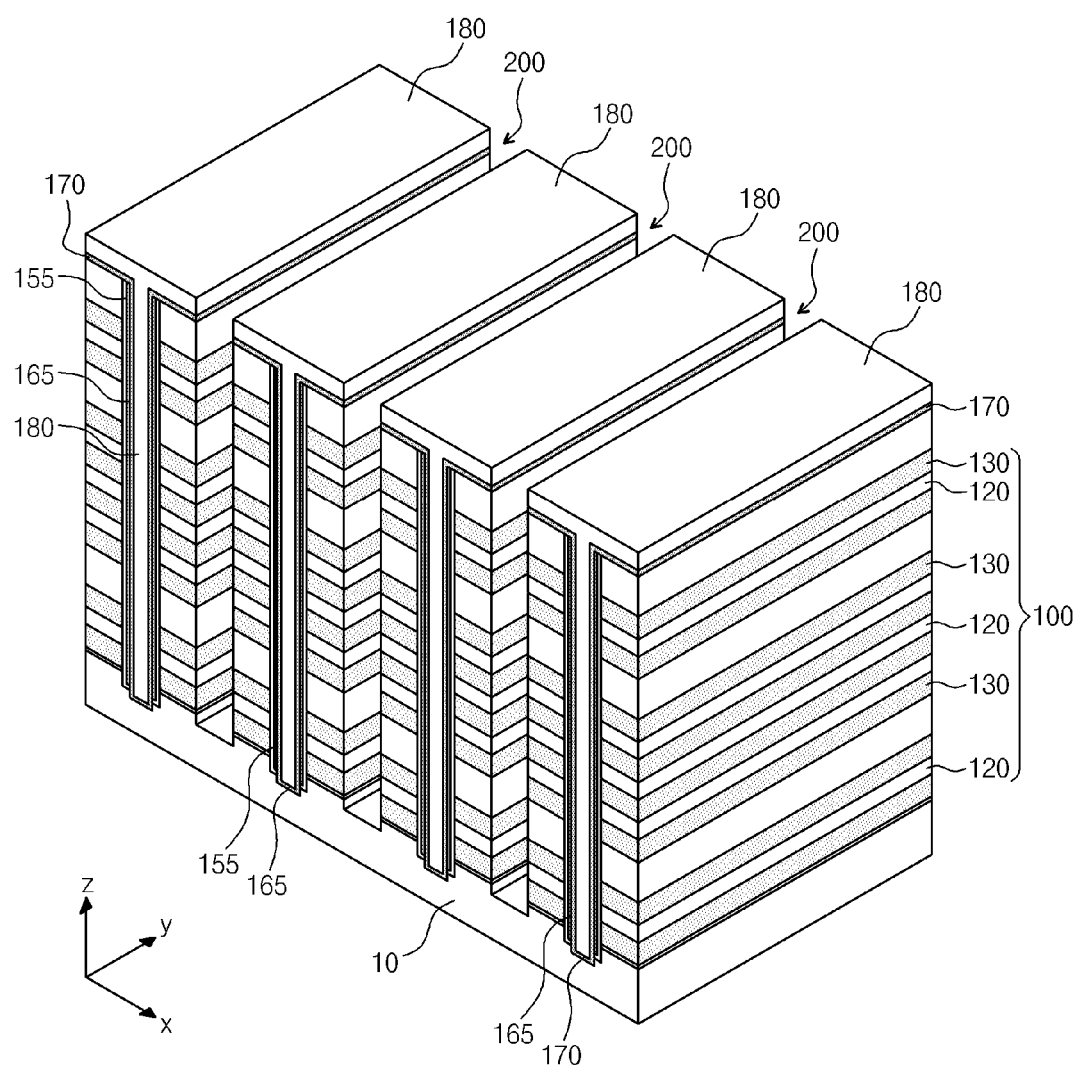

Referring to FIG. 39, trenches 200 are formed to penetrate the structure and to expose sidewalls of the sacrificial and insulation films 130 and 120. The trenches 200 are spaced apart from the openings 105 so as to traverse between the openings 105. Forming the trenches 200 may include forming an etch mask on an upper surface of the structure 100 or the buried insulation film 180 and anisotropic-etching films under the etch mask until an upper surface of the substrate 10 is exposed. Upper openings of the trenches 200 are defined by patterning the films 170 and 180 at an upper side of the structure 100. As an over-etch result of an anisotropic etch process, the substrate 10 under the trenches 200 is able to be recessed.

Figure 40:
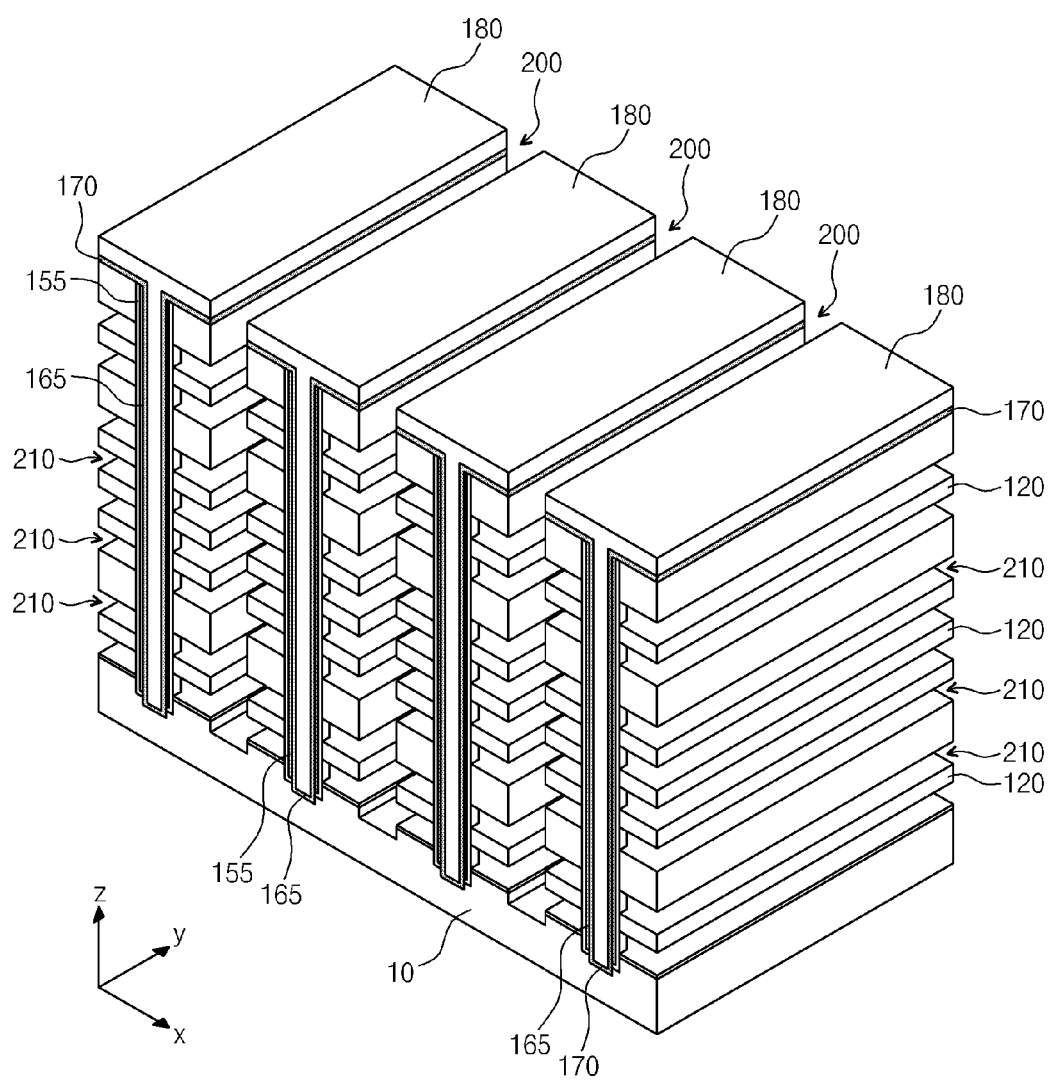

Referring to FIG. 40, recess areas 210 are formed among insulation films 120 by selectively removing exposed sacrificial films 130. The recess areas 210 may be cap areas which are formed to be extended horizontally from the trenches 200 and may be formed to expose sidewalls of vertical patterns 155. In particular, an outer boundary of the recess area 210 can be defined by insulation films 120 placed at upper and lower sides of the recess area 210 and trenches 200 placed at both sides thereof. Further, an internal boundary of the recess area 210 can be defined by vertical patterns 155 which vertically penetrating the recess area 210. Forming of the recess areas 210 may include etching the sacrificial films 130 horizontally using the etch recipe with the etch selectivity to the insulation films 120 and the vertical patterns 155. For example, in the event that the sacrificial films 130 are a silicon nitride film and the insulation films 120 is a silicon oxide film, the horizontal etch process may be made using the etchant including phosphoric acid.

Figure 41:
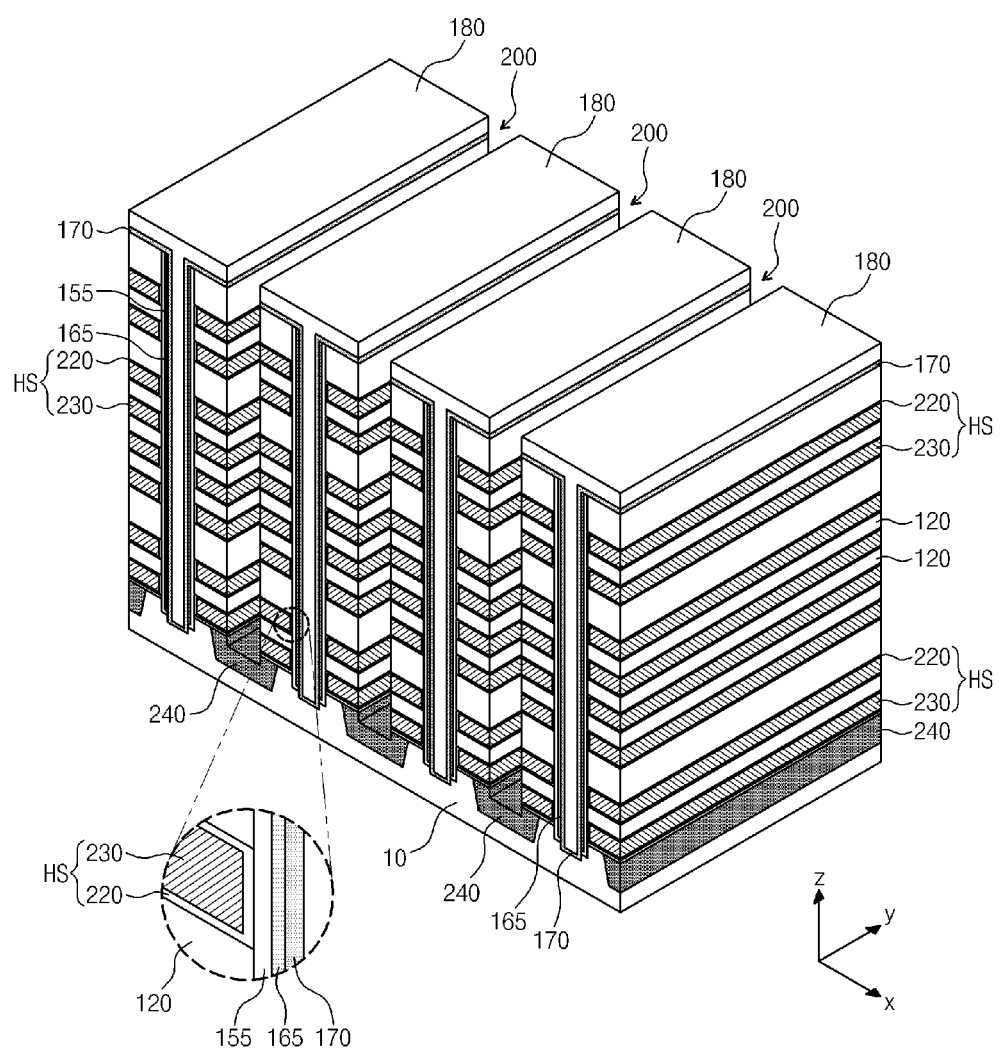

Referring to FIG. 41, horizontal structures HS are formed to fill the recess areas 210. The horizontal structure HS may include a horizontal pattern 220 covering an inner wall of the recess area 210 and a conductive pattern 230 filling the remaining space of the recess area 210. Forming of the horizontal structures HS may include sequentially forming a horizontal film and a conductive film to fill the recess areas 210 and removing the conductive film in the trenches 200 so as for conductive patterns 230 to remain in the recess areas 210. Like the case of the vertical film 150, the horizontal film or the horizontal patterns 220 may be formed of one ore more thin films. In an exemplary embodiment, the horizontal pattern 220 may include a block dielectric film of a charge trap type non-volatile memory transistor.

With an exemplary embodiment of the inventive concept for use in a non-volatile memory device, a process of forming impurity regions 240 is further made after forming conductive patterns 230. The impurity regions 240 are formed via an ion implanting process, and are formed within the substrate 10 exposed through the trenches 200. The impurity regions 240 have the conduction type different from that of the substrate 10. On the other hand, a region (hereinafter, referred to as a contact region) of the substrate 10 contacting the second semiconductor film 170 has the same conduction type as the substrate 10. The impurity regions 240 form PN junctions together with the substrate 10 or the second semiconductor film 170.

In an exemplary embodiment, the impurity regions 240 can be interconnected so as to maintain the equivalent state. In another embodiment, the impurity regions 240 can be separated electrically so as to have different potentials.

Figure 42:
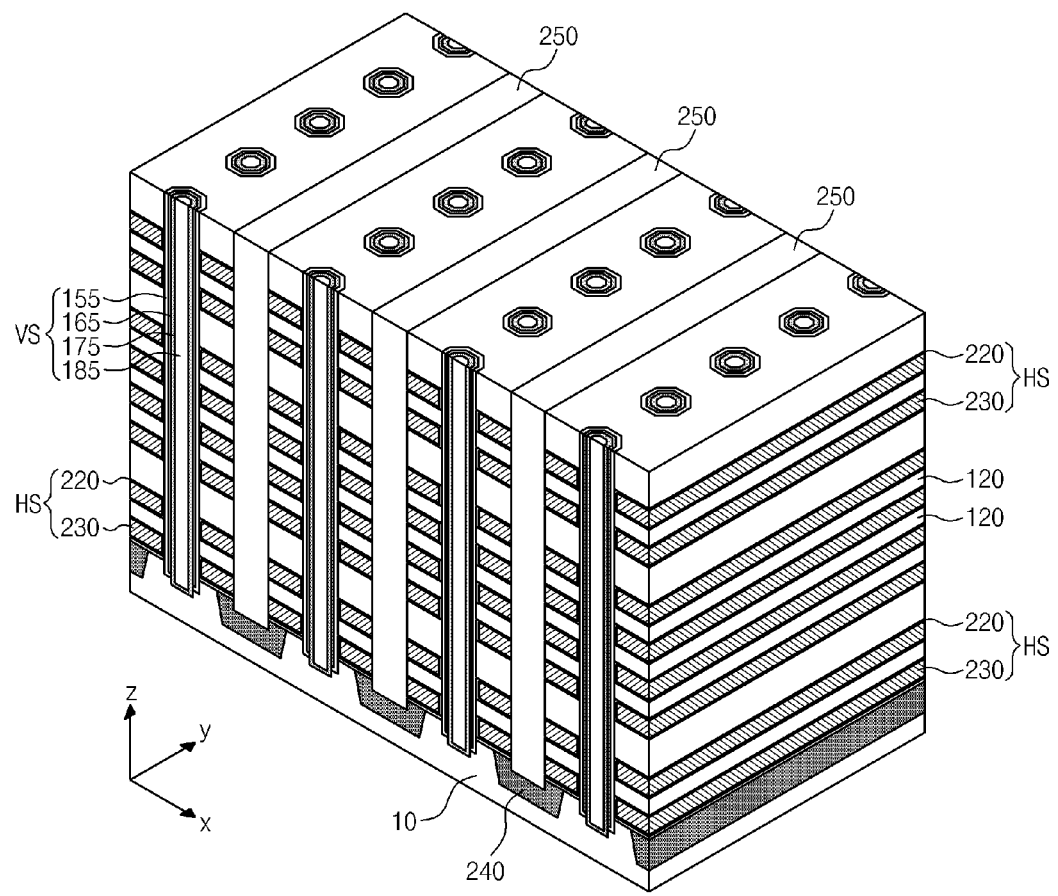

Referring to FIG. 42, an electrode separating pattern 250 is formed to fill the trenches 200. Forming of the pattern 250 may include forming an electrode separating film on a resultant structure including the impurity regions 240 and etching the resultant structure so as to expose an upper surface of the structure 100. The electrode separating film is formed of at least one of a silicon oxide film, a silicon nitride film, and a silicon nitrided oxide film. The etch process may be made using a planarization technology such as a chemical-mechanical polishing manner or an etch-back manner. As a result of the planarization process, the buried insulation film 180 and the second semiconductor film 170 may form buried patterns 185 and semiconductor bodies 175 which are disposed locally within respective openings 105.

In an exemplary embodiment of the general inventive concept, the vertical pattern 155, the semiconductor spacer 165, and the semiconductor body 175 may constitute a vertical structure VS. A plurality of vertical structures VS two-dimensionally arranged may be formed on the substrate 10 so as to penetrate the structure 100. Locations of the vertical structures VS are defined by the openings 105. On the other hand, the buried pattern 185 can form the vertical structure VS.

Figure 43:
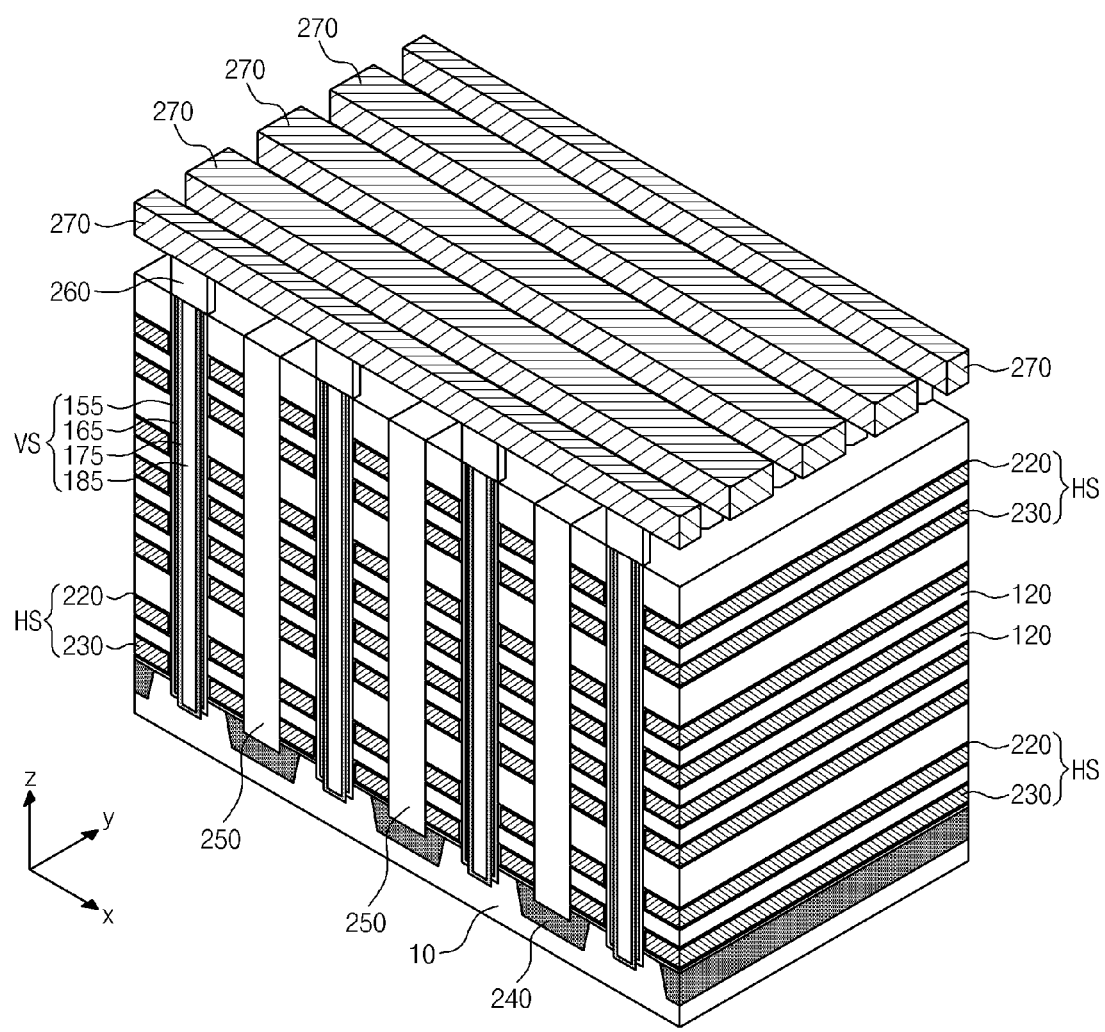

Referring to FIG. 43, upper plugs 260 are formed on the vertical structure VS, and upper wires 270 are formed on the upper plugs 260. Upper wires 270 are electrically connected to the semiconductor spacers 165 and the semiconductor bodies 175 via the upper plugs 260 and are formed to traverse the horizontal structures HS. With an embodiment for a non-volatile memory device, the upper wires 270 are used as bit lines connected to one ends of cell strings.

Figure 44:
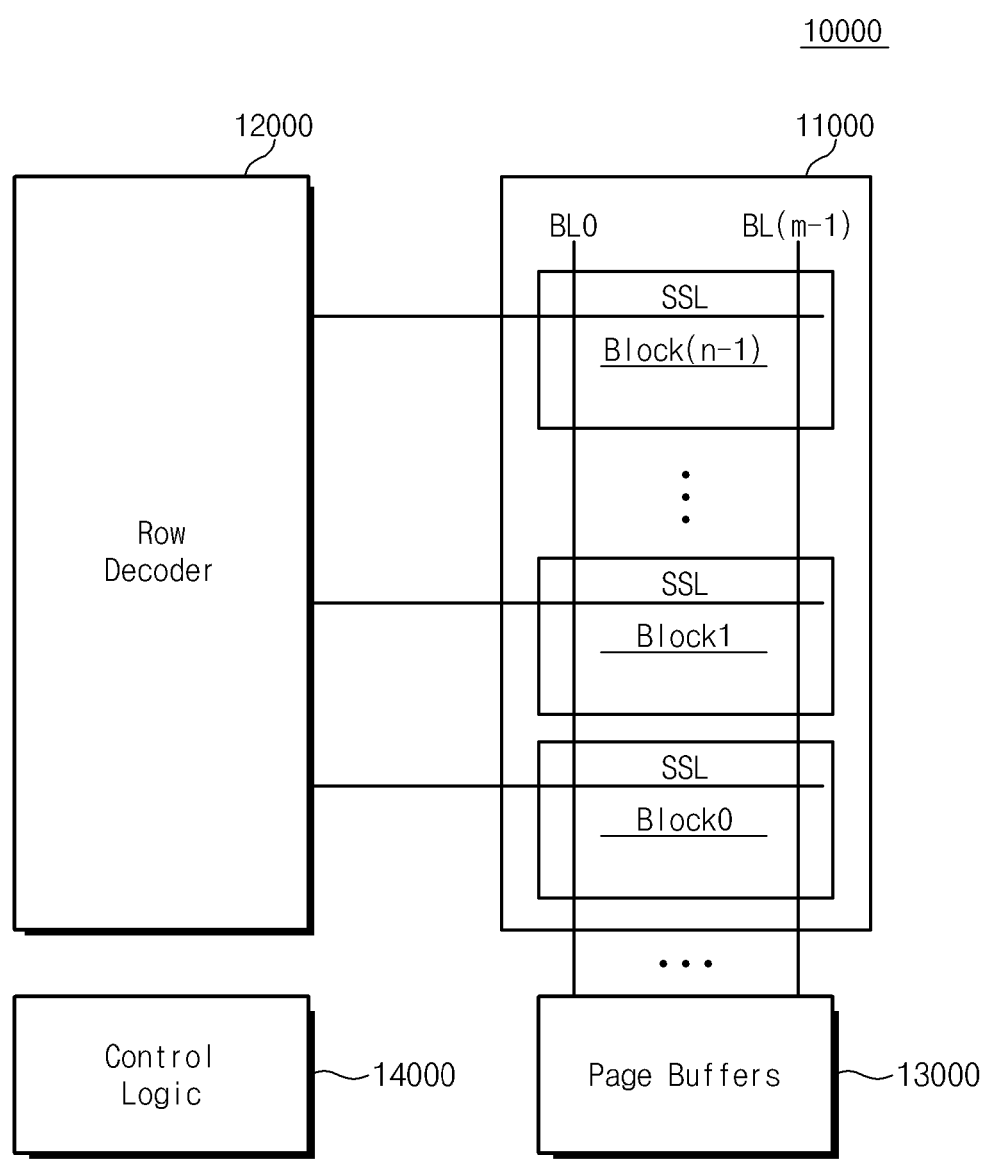
FIG. 44 is a block diagram showing a non-volatile memory device according to still another exemplary embodiment of the inventive concept.

FIG. 44 is a block diagram showing a non-volatile memory device according to still another exemplary embodiment of the general inventive concept.

Referring to FIG. 44, a non-volatile memory device 10000 includes a memory cell array 11000 which has a plurality of memory blocks. The memory blocks of the memory cell array 11000 may be configured to share a plurality of bit lines BL0 to BLm−1. That is, the memory cell array 11000 may be configured to have a two-dimensional array structure. Each of the memory blocks may include a plurality of strings each corresponding to the bit lines BL0 to BLm−1. Strings of each memory block may be connected to corresponding bit lines BL0 to BLm−1 via selection transistors which are controlled commonly by a string selection line SSL. String selection lines SSL arranged at the memory blocks are connected to a row decoder circuit 12000. The bit lines BL0 to BLm−1 may be connected to a read and write block 13000 which is formed of page buffers. The control logic 14000 may control the row decoder circuit 12000 to simultaneously activate selection lines SSL arranged at all or a part of the memory blocks. The control logic 14000 may control the read and write block 13000 so as to drive each bit line with a bit line program voltage (for example, a ground voltage) whenever selection lines SSL arranged at all or a part of the memory blocks are activated at the same time. This may be made to be substantially identical to that described above.

In an exemplary embodiment, it is well understood that the above-described verify manners are applied to the memory device 10000 shown in FIG. 44.

Figure 45:
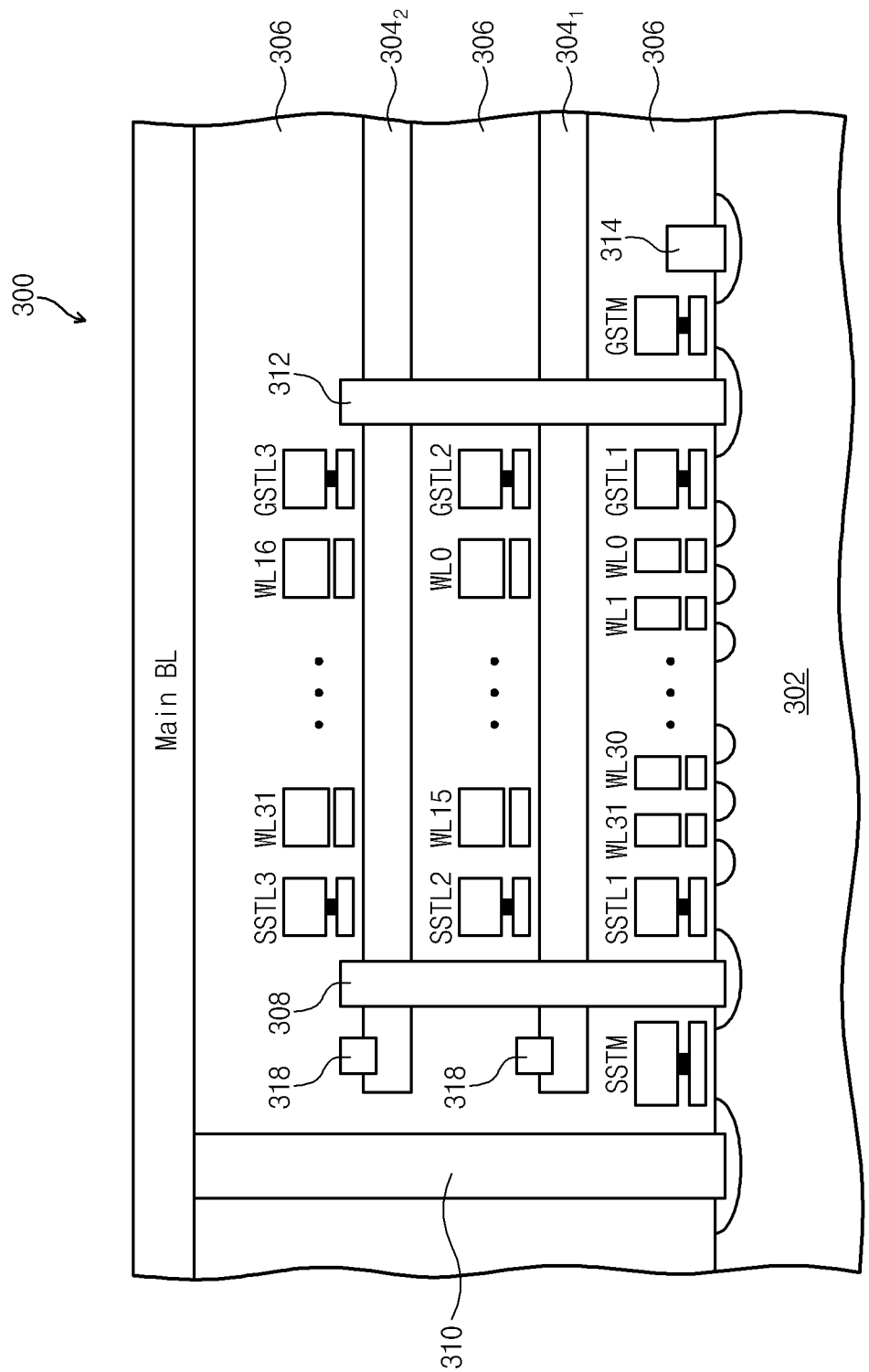
FIG. 45 is a cross-sectional view of a 3D memory array according to another exemplary embodiment of the inventive concept.

FIG. 45 is a cross-sectional view of a 3D memory array according to another exemplary embodiment of the general inventive concept.

A 3D memory array 300 may be a flash memory array, a read only memory array, a static random access memory array, a Silicon-Oxide-Nitride-Oxide-Silicon (SONOS) memory array, or the like.

The memory array 300 includes a substrate 302 formed of silicon or the like. A plurality, for example, 2 memory material layers $304_1$ and $304_2$ are formed at different levels of the memory array 300, respectively. In particular, the memory material layers $304_1$ and $304_2$ are overlapped or stacked on the substrate 302. An insulation layer 306 such as oxide film is formed between continuous memory material layers $304_1$ and $304_2$ so as to isolate memory material layers $304_1$ and $304_2$ each other.

Strings of memory cells are formed on the substrate 302 and the memory material layers $304_1$ and $304_2$. In FIG. 45, there is shown an example that one string is formed on each of the substrate 302 and the memory material layers $304_1$ and $304_2$. A string may include the first selection transistor, the second selection transistor, and a plurality of memory cells serially connected between the first and second transistors. For example, a string formed on the substrate 102 includes the first selection transistor SSTL1, the second selection transistor GSTL1, and a plurality of memory cells serially connected between the first and second transistors SSTL1 and GSTL1, a string formed on the memory material layer $304_1$ includes the first selection transistor SSTL2, the second selection transistor GSTL2, and a plurality of memory cells serially connected between the first and second transistors SSTL2 and GSTL2, and a string formed on the memory material layer $304_2$ includes the first selection transistor SSTL3, the second selection transistor GSTL3, and a plurality of memory cells serially connected between the first and second transistors SSTL3 and GSTL3.

Drains of the first selection transistors SSTL1 to SSTL3 are connected commonly to a contact plug 308, which is connected with a source of a main string selection transistor SSTM. A drain of the main string selection transistor SSTM is electrically connected to a contact plug 310, which is connected with a bit line MBL. The bit line MBL is used as a main bit line, and the contact plug 308 is used as a local bit line. Sources of the second selection transistors GSTL1 to GSTL3 are connected commonly to a contact plug 312, which is connected with a drain of a main ground selection transistor GSTM. A source of the main ground selection transistor GSTM is electrically connected to a common source line (CSL) 314. The CSL 314 is used as a main common source line, and the contact plug 312 is used as a local common source line. Contact plugs 318 provide a bias voltage to the memory material layer 304.

In an exemplary embodiment of the general inventive concept, memory cells are formed of one of various cell structures having a charge storage layer. Cell structures having a charge storage layer include a charge trap flash structure using a charge trap layer, a stack flash structure in which arrays are stacked in a multiple layer, a vertical channel memory structure in which channels of strings are formed vertically to a substrate, a source-drain free flash structure, a pin-type flash structure, etc.

A memory device having a charge trap flash structure as a charge storage layer is disclosed in U.S. Pat. No. 6,858,906 and U.S. Publication Nos. 2004/0169238 and 2006/0180851, the entirety of which are incorporated by reference herein. A source-drain free flash structure is described in KR Patent No. 673020, the entirety of which is incorporated by reference herein.

A non-volatile memory device and/or a controller according to the inventive concept may be packed using various types of packages. For example, A non-volatile memory device or a controller according to the general inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A non-volatile memory device comprising:
a memory cell array including a plurality of strings of transistors arranged in series, the strings arranged in rows and columns;
the strings of each column being connected with a bit line via selection transistors each controlled by corresponding selection lines, and the strings of each row being connected with bit lines via selection transistors each controlled by corresponding selection lines;
a row decoder circuit configured to drive the selection lines; and
a control logic controlling the row decoder circuit to drive selection lines of each row simultaneously or individually according to a mode of operation.

2. The non-volatile memory device of claim 1, further comprising a read and write block configured to drive the bit lines.

3. The non-volatile memory device of claim 2, wherein the control logic controls the row decoder circuit to activate all or a part of selection lines in each column simultaneously according to data to be programmed, and the control logic controls the read and write block to drive one of the bit lines with a bit line program voltage, with all or a part of selection lines in each column being activated simultaneously.

4. The non-volatile memory device of claim 3, wherein the control logic controls the row decoder circuit to simultaneously activate all or a part of selection lines in each column according to data to be programmed in selected memory cells in each column.

5. The non-volatile memory device of claim 4, wherein the driving of one bit line with a bit line program voltage is made until the bit lines are all selected.

6. The non-volatile memory device of claim 5, wherein the control logic controls the read and write block to sequentially drive the bit lines with the bit line program voltage regardless of data to be programmed.

7. The non-volatile memory device of claim 6, wherein the control logic controls the read and write block and the row decoder circuit to charge channels of strings connected with the bit lines up to a power supply voltage, prior to driving the bit lines with the bit line program voltage, respectively.

8. The non-volatile memory device of claim 1, wherein each of the strings is a vertical string which is formed to be vertical to a substrate.

9. The non-volatile memory device of claim 8, wherein each of the vertical strings includes memory cell transistors controlled by corresponding word lines formed on word line layers, word lines on the same word line layer being connected electrically each other.

10. The non-volatile memory device of claim 9, wherein the word lines on the same word line layer are driven by a program voltage at the same time.

11. The non-volatile memory device of claim 9, wherein the control logic comprises:
a memory storing a plurality of page data to be stored in memory cell transistors connected with word lines on a selected word line layer; and
a selection signal generator activating all or a part of selection signals each to be sent to selection lines in each column at the same time depending upon the plurality of page data stored in the memory.

12. The non-volatile memory device of claim 11, wherein the plurality of page data stored in the memory is updated according to a verify result.

13. A data storage system comprising:
a non-volatile memory device; and
a controller controlling the non-volatile memory device,
wherein the non-volatile memory device includes a plurality of strings arranged in rows and columns, the strings of each column being connected with a bit line via selection transistors each controlled by corresponding selection lines, and the strings of each row being connected with bit lines via selection transistors each controlled by corresponding selection lines; and
wherein the non-volatile memory device performs a program operation by activating all or a part of selection lines in one column at the same time depending upon data to be programmed; driving a bit line corresponding to the one column with a bit line program voltage; repeating the activating and the driving until bit lines corresponding to the columns are all driven; and applying a program voltage to the word lines.

14. The data storage system of claim 13, wherein strings defined by each row and the columns constitute a memory block.

15. A non-volatile memory device, comprising:
a plurality of strings of transistors connected in series, the plurality of strings of transistors arranged in rows and columns;
a plurality of bit lines, each bit line connected to each string in a column of strings;
a plurality of word lines, each word line connected to each string of a row of strings; and
control logic to performing at least one of a program and a verify operation simultaneously on transistors from a plurality of strings.

16. The non-volatile memory device of claim 15, further comprising a plurality of string selection transistors corresponding to the plurality of strings, respectively.

17. The non-volatile memory device of claim 16, wherein the control logic performs the program operation by simultaneously turning on at least two string selection transistors from among the plurality of string selection transistors and applying a predetermined voltage to a bit line connected to the at least two string selection transistors.

18. The non-volatile memory device of claim 16, wherein the control logic performs the verify operation by simultaneously applying a verify voltage to each word line corresponding to a column of transistors while turning off each string selection transistor corresponding to the strings in which the column of transistors are located.

19. The non-volatile memory device of claim 15, wherein the plurality of word lines comprises a plurality of conductive patterns formed in layers stacked on a substrate.

20. The non-volatile memory device of claim 19, wherein the plurality of strings comprises a plurality of columns of semiconductor material arranged vertically with respect to the substrate to intersect the plurality of word lines.

* * * * *